United States Patent
Tsubouchi

(10) Patent No.: US 9,726,784 B2
(45) Date of Patent: Aug. 8, 2017

(54) NEAR-INFRARED CUT FILTER AND DEVICE INCLUDING NEAR-INFRARED CUT FILTER

(75) Inventor: Takashi Tsubouchi, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/344,904

(22) PCT Filed: Sep. 3, 2012

(86) PCT No.: PCT/JP2012/072360
§ 371 (c)(1),
(2), (4) Date: Mar. 13, 2014

(87) PCT Pub. No.: WO2013/038938
PCT Pub. Date: Mar. 21, 2013

(65) Prior Publication Data
US 2014/0350146 A1   Nov. 27, 2014

(30) Foreign Application Priority Data
Sep. 15, 2011  (JP) .................................. 2011-202121

(51) Int. Cl.
*G02B 1/04* (2006.01)
*G02B 5/20* (2006.01)
(Continued)

(52) U.S. Cl.
CPC .............. *G02B 1/04* (2013.01); *C08K 5/3417* (2013.01); *G02B 5/208* (2013.01);
(Continued)

(58) Field of Classification Search
CPC ........ G02B 1/04; G02B 5/208; C08K 5/3417; H01L 27/14621; H01L 27/14625; H01L 27/14618
(Continued)

(56) References Cited

U.S. PATENT DOCUMENTS

| | | | | |
|---|---|---|---|---|
| 5,543,086 A | * | 8/1996 | Bertelson et al. | 252/582 |
| 2009/0009899 A1 | * | 1/2009 | Nakamaru et al. | 359/887 |

FOREIGN PATENT DOCUMENTS

| | | |
|---|---|---|
| CN | 101688936 A | 3/2010 |
| JP | H01-228960 A | 9/1989 |

(Continued)

OTHER PUBLICATIONS

Machine translation of JP 2008-298820. Dec. 2008.*
(Continued)

*Primary Examiner* — John Uselding
(74) *Attorney, Agent, or Firm* — Oblon, McClelland, Maier & Neustadt, L.L.P.

(57) ABSTRACT

The present invention provides a near-infrared cut filter comprises a resin substrate (I) which comprises a resin and a light absorber (A) having a structure derived from a compound represented by the following Formula (I), wherein the light absorber (A) is contained in the resin substrate (I) in an amount of 0.001 to 0.01 parts by weight with respect to 100 parts by weight of the resin.

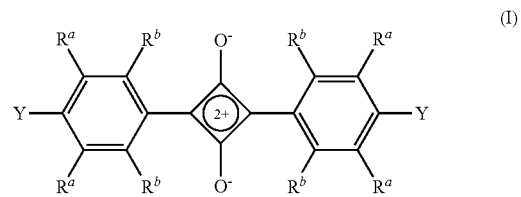

7 Claims, 3 Drawing Sheets (a)

(b)

(51) Int. Cl.
*H01L 27/146* (2006.01)
*C08K 5/3417* (2006.01)

(52) U.S. Cl.
CPC .. *H01L 27/14618* (2013.01); *H01L 27/14621* (2013.01); *H01L 27/14625* (2013.01); *H01L 2924/0002* (2013.01)

(58) Field of Classification Search
USPC .......................................................... 524/94
See application file for complete search history.

(56) References Cited

FOREIGN PATENT DOCUMENTS

| JP | H01-228961 A | 9/1989 |
|---|---|---|
| JP | 06-200113 | 7/1994 |
| JP | 2000-265077 | 9/2000 |
| JP | 2001-117201 | 4/2001 |
| JP | 2004-004232 | 1/2004 |
| JP | 2005-338395 | 12/2005 |
| JP | 2008-298820 | 12/2008 |
| JP | 2009-040860 | 2/2009 |
| JP | 2011-100084 | 5/2011 |

OTHER PUBLICATIONS

Machine translation of JP H01-228960. Dec. 1989.*
Machine translation of JP H01-228961. Dec. 1989.*
International Search Report for corresponding International Application No. PCT/JP2012/072360, Dec. 4, 2012.
Combined Chinese Office Action and Search Report issued Jul. 31, 2015 in Patent Application No. 201280044439.3 (with English translation of categories of cited documents).
Office Action dated Sep. 6, 2016, in Japanese Patent Application No. 2013-533613 (w/ computer-generated English translation).

* cited by examiner

NEAR-INFRARED CUT FILTER AND DEVICE INCLUDING NEAR-INFRARED CUT FILTER

TECHNICAL FIELD

The present invention relates to a near-infrared cut filter. More particularly, the present invention relates to a near-infrared cut filter which has a sufficient viewing angle and can be suitably used particularly as a spectral luminous efficacy correction filter for a solid-state image sensing element such as CCD or CMOS image sensor.

BACKGROUND ART

In recent years, CCDs and CMOS image sensors, which are solid-state image sensing elements for color images, are used in solid-state imaging devices such as video camcorders, digital still cameras and camera-equipped cell phones. These solid-state image sensing elements utilize, in their light-receiving sections, silicon photodiodes that are sensitive to near-infrared ray imperceptible to human eyes. In such solid-state image sensing elements, it is required that spectral luminous efficacy correction be performed so that colors that are natural to human eyes are produced and, therefore, a near-infrared cut filter which selectively transmits or cuts light rays in a specific wavelength range is often used.

As such a near-infrared cut filter, those filters that are produced by a variety of methods have been conventionally used. For example, a filter in which reflection of near-infrared ray is attained by vapor-deposition of a metal such as silver on a transparent base material such as glass and a filter in which a near infrared-absorbing dye is added to a transparent resin such as an acrylic resin or a polycarbonate resin have been put into practice.

However, a near-infrared cut filter in which a metal is vapor-deposited on a glass substrate not only requires a high production cost, but also has a problem in that, as foreign substance, fragments of the glass substrate cause contamination at the time of cutting the filter. Furthermore, the use of an inorganic material as a substrate has limitations in adapting to the recent reductions in size and thickness of solid-state imaging devices.

Meanwhile, JP-A-H6-200113 (Patent Document 1) discloses a near-infrared cut filter in which a transparent resin is used as a substrate and a near infrared-absorbing dye is incorporated into the transparent resin.

However, the near-infrared cut filter according to Patent Document 1 does not necessarily have sufficient near infrared-absorbing capacity.

Further, the present applicant has proposed near-infrared cut filters comprising a norbornene-based resin substrate and a near infrared-reflecting film in JP-A-2005-338395 (Patent Document 2) and JP-A-2011-100084 (Patent Document 3).

PRIOR ART DOCUMENTS

Patent Documents

[Patent Document 1] JP-A-H6-200113
[Patent Document 2] JP-A-2005-338395
[Patent Document 3] JP-A-2011-100084

SUMMARY OF THE INVENTION

Problems to be Solved by the Invention

The near-infrared cut filter according to Patent Document 2 is excellent in terms of the near infrared-cutting capacity, moisture absorption resistance and impact resistance; however, this filter may not be able to attain a sufficient viewing angle.

The near-infrared cut filter according to Patent Document 3 is excellent in its near infrared-cutting capacity, moisture absorption resistance and impact resistance and has a wide viewing angle; however, it may not be able to attain a sufficient transmittance in the visible region.

An object of the present invention is to provide a near-infrared cut filter having high transmittance in the visible region, a wide viewing angle and excellent near infrared-cutting capacity, which can be suitably used particularly in solid-state image sensing elements such as CCDs and CMOS image sensors.

Technical Solution

[1] A near-infrared cut filter, characterized by comprising a resin substrate (I) which comprises a resin and a light absorber (A) having a structure derived from a compound represented by the following Formula (I), wherein the light absorber (A) is contained in the resin substrate (I) in an amount of 0.001 to 0.01 parts by weight with respect to 100 parts by weight of the resin:

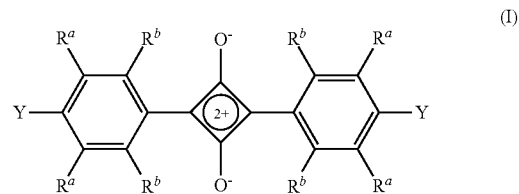

(I)

[wherein, $R^a$, $R^b$ and Y satisfy the following (i) or (ii):

(i) $R^a$s independently represent a hydrogen atom, an alkyl group having 1 to 8 carbon atoms, a —$NR^eR^f$ group (wherein, $R^e$ and $R^f$ each independently represent a hydrogen atom or an alkyl group having 1 to 5 carbon atoms) or a hydroxy group; $R^b$s independently represent a hydrogen atom, an alkyl group having 1 to 5 carbon atoms, a —$NR^gR^h$ group (wherein, $R^g$ and $R^h$ each independently represent a hydrogen atom, an alkyl group having 1 to 5 carbon atoms or a —C(O)$R^i$ group (wherein, $R^i$ represents an alkyl group having 1 to 5 carbon atoms)) or a hydroxy group; and Ys independently represent a —$NR^jR^k$ group (wherein, $R^j$ and $R^k$ each independently represent a hydrogen atom, an aliphatic hydrocarbon group having 1 to 8 carbon atoms, a substituted aliphatic hydrocarbon group having 1 to 8 carbon atoms in which an arbitrary hydrogen atom is substituted with a substituent, an aromatic hydrocarbon group having 6 to 12 carbon atoms or a substituted aromatic hydrocarbon group having 6 to 12 carbon atoms in which an arbitrary hydrogen atom is substituted with an alkyl group), or (ii) one of two $R^a$s on one benzene ring and Y on the same benzene ring bind with each other to form a heterocycle which is constituted by 5 or 6 atoms and contains at least one nitrogen atom; and $R^b$s and $R^a$s not involved in the binding each independently have the same meaning as in the above-described (i)].

[2] The near-infrared cut filter according to [1], characterized in that the compound represented by the Formula (I) is a compound represented by the following Formula (II):

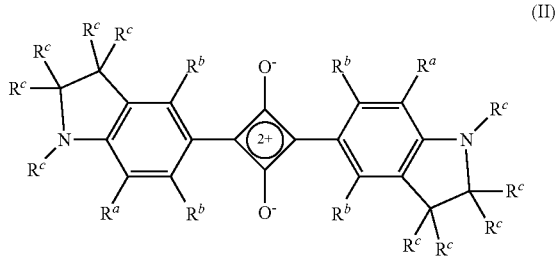

(II)

[wherein, R$^a$s and R$^b$s each independently have the same meaning as in (i) of the Formula (I); and R$^c$s independently represent a hydrogen atom, an aliphatic hydrocarbon group having 1 to 8 carbon atoms, a substituted aliphatic hydrocarbon group having 1 to 8 carbon atoms in which an arbitrary hydrogen atom is substituted with a substituent, an aromatic hydrocarbon group having 6 to 12 carbon atoms or a substituted aromatic hydrocarbon group having 6 to 12 carbon atoms in which an arbitrary hydrogen atom is substituted with an alkyl group].

[3] A near-infrared cut filter, characterized by comprising a resin substrate (I'), which comprises a light absorber and a resin, and having transmittance satisfying the following (A) to (D):

(A) in a wavelength range of 430 to 580 nm, the average transmittance measured in the vertical direction of the near-infrared cut filter is 80% or higher;

(B) in a wavelength range of 630 to 650 nm, the average transmittance measured in the vertical direction of the near-infrared cut filter is 70% or higher;

(C) in a wavelength range of 800 to 1,000 nm, the average transmittance measured in the vertical direction of the near-infrared cut filter is 20% or lower; and (D) in a wavelength range of 550 to 700 nm, the absolute value of the difference between the value of the wavelength at which the transmittance measured in the vertical direction of the near-infrared cut filter is 75% (Ya) and the value of the wavelength at which the transmittance measured at an angle of 30° with respect to the vertical direction of the near-infrared cut filter is 75% (Yb) is less than 15 nm.

[4] The near-infrared cut filter according to [3], characterized in that the light absorber is a light absorber (A) having a structure derived from a compound represented by the following Formula (I):

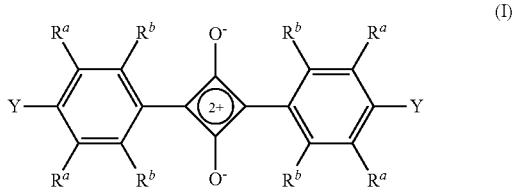

(I)

[wherein, R$^a$, R$^b$ and Y satisfy the following (i) or (ii):

(i) R$^a$s independently represent a hydrogen atom, an alkyl group having 1 to 8 carbon atoms, a —NR$^e$R$^f$ group (wherein, R$^e$ and R$^f$ each independently represent a hydrogen atom or an alkyl group having 1 to 5 carbon atoms) or a hydroxy group; R$^b$s independently represent a hydrogen atom, an alkyl group having 1 to 5 carbon atoms, a —NR$^g$R$^h$ group (wherein, R$^g$ and R$^h$ each independently represent a hydrogen atom, an alkyl group having 1 to 5 carbon atoms or a —C(O)R$^i$ group (wherein, R$^i$ represents an alkyl group having 1 to 5 carbon atoms)) or a hydroxy group; and Ys independently represent a —NR$^j$R$^k$ group (wherein, R$^j$ and R$^k$ each independently represent a hydrogen atom, an aliphatic hydrocarbon group having 1 to 8 carbon atoms, a substituted aliphatic hydrocarbon group having 1 to 8 carbon atoms in which an arbitrary hydrogen atom is substituted with a substituent, an aromatic hydrocarbon group having 6 to 12 carbon atoms or a substituted aromatic hydrocarbon group having 6 to 12 carbon atoms in which an arbitrary hydrogen atom is substituted with an alkyl group), or (ii) one of two R$^a$s on one benzene ring and Y on the same benzene ring bind with each other to form a heterocycle which is constituted by 5 or 6 atoms and contains at least one nitrogen atom; and R$^b$s and R$^a$s not involved in the binding each independently have the same meaning as in the above-described (i)].

[5] The near-infrared cut filter according to [4], characterized in that the compound represented by the Formula (I) is a compound represented by the following Formula (II):

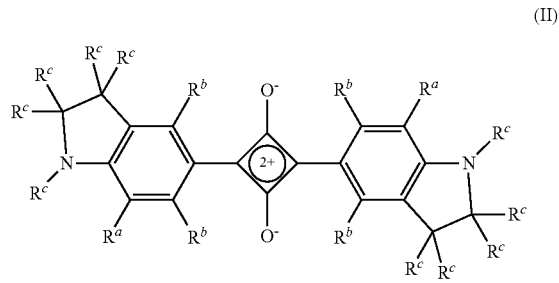

(II)

[wherein, R$^a$s and R$^b$s each independently have the same meaning as in (i) of the Formula (I); and R$^c$s independently represent a hydrogen atom, an aliphatic hydrocarbon group having 1 to 8 carbon atoms, a substituted aliphatic hydrocarbon group having 1 to 8 carbon atoms in which an arbitrary hydrogen atom is substituted with a substituent, an aromatic hydrocarbon group having 6 to 12 carbon atoms or a substituted aromatic hydrocarbon group having 6 to 12 carbon atoms in which an arbitrary hydrogen atom is substituted with an alkyl group].

[6] The near-infrared cut filter according to [4] or [5], characterized in that the light absorber (A) is contained in the resin substrate (I') in an amount of 0.001 to 0.01 parts by weight with respect to 100 parts by weight of the resin.

[7] The near-infrared cut filter according to any one of [1] to [6], characterized in that the resin is a cyclic olefin-based resin or an aromatic polyether-based resin.

[8] The near-infrared cut filter according to any one of [1] to [7], characterized by being used as a near-infrared cut filter for a solid-state image sensing element.

[9] A solid-state imaging device, characterized by comprising the near-infrared cut filter according to any one of [1] to [8].

[10] A camera module, characterized by comprising the near-infrared cut filter according to any one of [1] to [8].

Advantageous Effects of Invention

According to the present invention, a near-infrared cut filter having high transmittance in the visible region, an absorption (transmission) wavelength with a small dependence on the incidence angle, a wide viewing angle, excellent near infrared-cutting capacity and a low hygroscopicity, in which film warping is not likely to occur and no foreign substance is contained, can be produced.

Further, according to the present invention, a solid-state imaging device, a camera module and the like can be made thinner and smaller.

DESCRIPTION OF EMBODIMENTS

Figure 1:
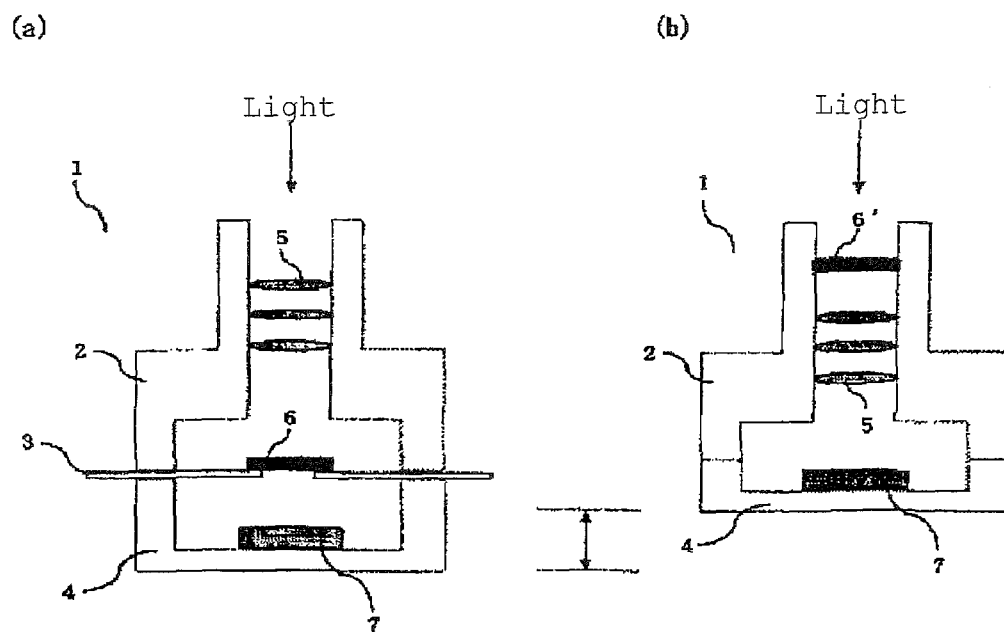
FIG. 1(a) is a cross-sectional schematic view showing one example of conventional camera modules.
FIG. 1(b) is a cross-sectional schematic view showing one example of camera modules in which a near-infrared cut filter 6' obtained in the present invention is used.

The present invention will now be described concretely.
[Near-Infrared Cut Filter]

The near-infrared cut filter of the present invention is characterized by comprising a resin substrate (I) which comprises 0.001 to 0.01 parts by weight of a light absorber (A) having a structure derived from a compound having a squarylium structure represented by the following Formula (I) (hereinafter, also referred to as "compound (I)") and 100 parts by weight of a resin. It is preferred that the near-infrared cut filter of the present invention comprise the below-described resin substrate (I) and the below-described near infrared-reflecting film.

By having such a resin substrate (I), the near-infrared cut filter of the present invention particularly has a small dependence on the incidence angle.

Further, the near-infrared cut filter of the present invention is characterized by comprising a resin substrate (I'), which comprises a light absorber (hereinafter, also referred to as "light absorber (A')") and a resin, and having transmittance satisfying the following (A) to (D):

(A) in a wavelength range of 430 to 580 nm, the average transmittance measured in the vertical direction of the near-infrared cut filter is 80% or higher;

(B) in a wavelength range of 630 to 650 nm, the average transmittance measured in the vertical direction of the near-infrared cut filter is 70% or higher;

(C) in a wavelength range of 800 to 1,000 nm, the average transmittance measured in the vertical direction of the near-infrared cut filter is 20% or lower; and (D) in a wavelength range of 550 to 700 nm, the absolute value of the difference between the value of the wavelength at which the transmittance measured in the vertical direction of the near-infrared cut filter is 75% (Ya) and the value of the wavelength at which the transmittance measured at an angle of 30° with respect to the vertical direction of the near-infrared cut filter is 75% (Yb) is less than 15 nm.

<<Resin Substrate>>

The above-described resin substrate (I) comprises a light absorber (A) and a resin and the above-described resin substrate (I') comprises a light absorber (A') and a resin. This light absorber (A') is preferably the above-described light absorber (A).

Hereinafter, the resin substrates (I) and (I') are each also simply referred to as "resin substrate".

It is preferred that the resin substrate satisfy the following (E) and (F).

(E) It is desired that the absorption maximum be at a wavelength of 640 to 800 nm, preferably 660 to 750 nm, more preferably 670 to 730 nm.

When a substrate has an absorption maximum wavelength in this range, the substrate can selectively and efficiently cut near-infrared ray.

(F) At a wavelength of 640 nm, it is desired that the transmittance measured in the vertical direction of the resin substrate be 65% or higher, preferably 70% or higher, more preferably 75% or higher, particularly preferably 80% or higher.

In the resin substrate, in cases where the absorption maximum is in the above-described range and the transmittance measured in the vertical direction at a wavelength of 640 nm is also in the above-described range, the transmittance changes abruptly at a wavelength around the near-infrared wavelength region when light comes into the filter.

When such a resin substrate is used in a near-infrared cut filter, the filter has a small absolute value of the difference between (Ya) and (Yb), an absorption wavelength with a small dependence on the incidence angle, and a wide viewing angle.

Further, when such a near-infrared cut filter comprising the resin substrate is used in a lens unit such as a camera module, it is preferred from the viewpoint that the lens unit can be made to have a low profile.

By using a substrate containing the light absorber (A) in a specific amount, a resin substrate satisfying the above-described (E) and (F) can be obtained.

Depending on the application such as a camera module, when the resin substrate has a thickness of 100 μm, the average transmittance of the substrate in the so-called visible region of 400 to 700 nm is preferably 50% or higher, more preferably 65% or higher.

The thickness of the resin substrate can be selected as appropriate in accordance with the desired application and it is not particularly restricted. However, it is preferred that the thickness of the resin substrate be adjusted such that the substrate satisfies the above-described (E) and (F), and the thickness is more preferably 50 to 250 μm, still more preferably 50 to 200 μm, particularly preferably 80 to 150 μm.

When the thickness of the resin substrate is in the above-described range, a near-infrared cut filter using the substrate can be reduced in size and weight and can thus be suitably used in a variety of applications such as solid-state imaging devices. Particularly, when such a near-infrared cut filter is used in a lens unit such as a camera module, it is preferred from the viewpoint that the lens unit can be made to have a low profile.

<Light Absorber (A')>

The above-described light absorber (A') is not particularly restricted as long as the resulting near-infrared cut filter satisfies the below-described (A) to (D); however, from the standpoint of enabling to easily obtain such a near-infrared cut filter, the light absorber (A') is preferably, for example, a phthalocyanine-based compound, a cyanine compound or a squarylium compound, and it is more preferably the below-described light absorber (A).

<Light Absorber (A)>

The light absorber (A) has a structure derived from the compound (I). The light absorber (A) is preferably a dye having a squarylium structure.

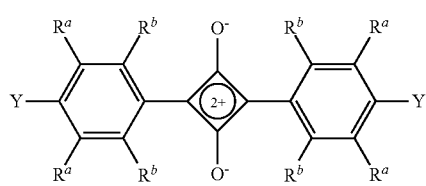

(I)

In the Formula (I), $R^a$, $R^b$ and Y satisfy the following (i) or (ii):

(i) $R^a$s independently represent a hydrogen atom, an alkyl group having 1 to 8 carbon atoms, a —$NR^eR^f$ group (wherein, $R^e$ and $R^f$ each independently represent a hydrogen atom or an alkyl group having 1 to 5 carbon atoms) or a hydroxy group; $R^b$s independently represent a hydrogen atom, an alkyl group having 1 to 5 carbon atoms, a —$NR^gR^h$ group (wherein, $R^g$ and $R^h$ each independently represent a hydrogen atom, an alkyl group having 1 to 5 carbon atoms or a —$C(O)R^i$ group (wherein, $R^i$ represents an alkyl group having 1 to 5 carbon atoms)) or a hydroxy group; and Ys independently represent a —$NR^jR^k$ group (wherein, $R^j$ and $R^k$ each independently represent a hydrogen atom, an aliphatic hydrocarbon group having 1 to 8 carbon atoms, a substituted aliphatic hydrocarbon group having 1 to 8 carbon atoms in which an arbitrary hydrogen atom is substituted with a substituent, an aromatic hydrocarbon group having 6 to 12 carbon atoms or a substituted aromatic hydrocarbon group having 6 to 12 carbon atoms in which an arbitrary hydrogen atom is substituted with an alkyl group), or (ii) one of two $R^a$s on one benzene ring and Y on the same benzene ring bind with each other to form a heterocycle which is constituted by 5 or 6 atoms and contains at least one nitrogen atom; and $R^b$s and $R^a$s not involved in the binding each independently have the same meaning as in the above-described (i).

Examples of the alkyl group having 1 to 8 carbon atoms represented by $R^a$ include a methyl group, an ethyl group, an n-propyl group, an i-propyl group, an n-butyl group, a s-butyl group, a t-butyl group, a pentyl group and a hexyl group and, in these groups, an arbitrary hydrogen atom may be substituted with a methyl group, an ethyl group or the like.

Examples of the alkyl group having 1 to 5 carbon atoms represented by $R^e$ and $R^f$ in the —$NR^eR^f$ group, the alkyl group having 1 to 5 carbon atoms represented by $R^b$, the alkyl group having 1 to 5 carbon atoms represented by $R^g$ and $R^h$ in the —$NR^gR^h$ group and the alkyl group having 1 to 5 carbon atoms represented by $R^i$ in the —$C(O)R^i$ group include a methyl group, an ethyl group, an n-propyl group, an i-propyl group, an n-butyl group, a s-butyl group, a t-butyl group and a pentyl group.

Examples of the aliphatic hydrocarbon group having 1 to 8 carbon atoms represented by $R^j$ and $R^k$ in the —$NR^jR^k$ group include chain aliphatic hydrocarbon groups such as a methyl group, an ethyl group, an n-propyl group, an i-propyl group, an n-butyl group, a s-butyl group, a t-butyl group, a pentyl group and a hexyl group; and cyclic aliphatic hydrocarbon groups such as a cyclopentyl group and a cyclohexyl group.

Examples of the substituted aliphatic hydrocarbon group having 1 to 8 carbon atoms in which an arbitrary hydrogen atom is substituted with a substituent, which group is represented by $R^j$ and $R^k$ in the —$NR^jR^k$ group, include substituted chain aliphatic hydrocarbon groups in which an arbitrary hydrogen atom(s) of the above-described chain aliphatic hydrocarbon groups is/are substituted with a substituent such as a —NR'R" group (wherein, R' and R" represent a chain aliphatic hydrocarbon group such as a methyl group, an ethyl group, an n-propyl group, an i-propyl group, an n-butyl group, a s-butyl group, a t-butyl group or a pentyl group), —CN, —OH or —OR (wherein, R represents a methyl group, an ethyl group or a propyl group); and substituted cyclic aliphatic hydrocarbon groups in which an arbitrary hydrogen atom(s) of the above-described cyclic aliphatic hydrocarbon groups is/are substituted with a methyl group, an ethyl group or the like.

Examples of the aromatic hydrocarbon group having 6 to 12 carbon atoms represented by $R^j$ and $R^k$ in the —$NR^jR^k$ group include a phenyl group and a benzyl group.

Examples of the substituted aromatic hydrocarbon group having 6 to 12 carbon atoms in which an arbitrary hydrogen atom is substituted with an alkyl group, which substituted aromatic hydrocarbon group is represented by $R^j$ and $R^k$ in the —$NR^jR^k$ group, include substituted phenyl groups in which an arbitrary hydrogen atom(s) of a phenyl group, a benzyl group or the like is/are substituted with a chain aliphatic hydrocarbon group such as a methyl group, an ethyl group, an n-propyl group, an i-propyl group, an n-butyl group, a s-butyl group, a t-butyl group or a pentyl group.

Examples of the heterocycle which is constituted by 5 or 6 atoms and contains at least one nitrogen atom, the heterocycle being formed by one of two $R^a$s on one benzene ring and Y on the same benzene ring in the (ii) of the Formula (I), include pyrrolidine, pyrrole, imidazole, pyrazole, piperidine, pyridine, piperazine, pyridazine, pyrimidine and pyrazine. Among these heterocycles, those in which one atom adjacent to a carbon atom constituting the heterocycle and the benzene ring is a nitrogen atom are preferred, and pyrrolidine is more preferred.

The compound (I) includes, for example, a compound (I-2) which is a resonance structure represented by the following Formula (I-1). That is, examples of the compound (I) include compound (I-1) and compound (I-2).

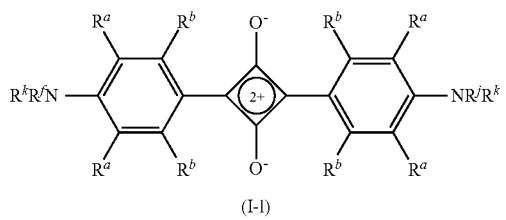

(I-1)

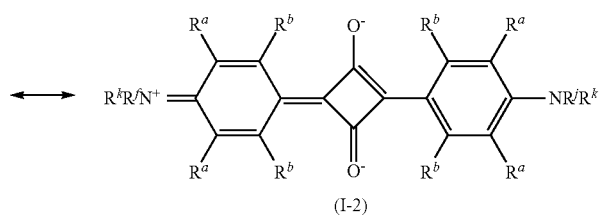

(I-2)

It is desired that the light absorber (A) be such a compound that, when the transmittance of a solution obtained by dissolving the light absorber (A) in a good solvent thereof is measured (optical path length: 1 cm), regardless of the concentration of the light absorber (A) in the solution, the solution has an absorption maximum at a wavelength of 640 to 800 nm and a transmittance of 65% or higher, preferably 70% or higher, more preferably 75% or higher, at a wavelength of 640 nm.

In conventional near-infrared cut filters, such a light absorber (A) was not used because, for example, it has a transmittance curve with steep slopes and a narrow absorption range in the near-infrared region and cannot withstand the glass molding temperature when it is mixed into a substrate such as glass to produce a near-infrared cut filter. It is thought that, if such a light absorber (A) is used, since its absorption range in the near-infrared region is narrow, the light absorber (A) would have to be added in a large amount in order to obtain a near-infrared cut filter having sufficient near infrared-cutting capacity and the resulting near-infrared cut filter would tend to have a low transmittance in the visible region. For these reasons, in the past, such a near-infrared cut filter of the present invention having high transmittance in the visible region and a small dependence on the incidence angle could not be obtained.

In the present invention, particularly by using the above-described light absorber (A), a near-infrared cut filter satisfying the above-described (E) and (F) can be obtained. Thus, the near-infrared cut filter of the present invention particularly has the below-described features (A), (B) and (D). By this, a near-infrared cut filter having a small dependence on the incidence angle and a wide viewing angle can be obtained.

Furthermore, conventionally, when the below-described near infrared-reflecting film was arranged on a substrate by vapor deposition or the like, there were cases where the property of the resulting near-infrared cut filter was deteriorated (e.g., narrow the viewing angle). However, the above-described resin substrate (I) comprising the light absorber (A) is capable of preventing deterioration in the property of a near-infrared cut filter that may be caused by arrangement of a near infrared-reflecting film on the substrate. Therefore, even when a near infrared-reflecting film is arranged on the resin substrate by vapor deposition or the like, the resulting near-infrared cut filter can attain a stable absorption wavelength range that is not dependent on the incidence angle of incoming light.

It is preferred that the compound (I) be a compound represented by the following Formula (II) (hereinafter, also referred to as "compound (II)"):

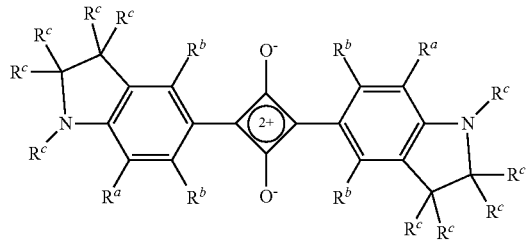

In the Formula (II), $R^a$s and $R^b$s each independently have the same meaning as in (i) of the Formula (I); and $R^c$s independently represent a hydrogen atom, an aliphatic hydrocarbon group having 1 to 8 carbon atoms, a substituted aliphatic hydrocarbon group having 1 to 8 carbon atoms in which an arbitrary hydrogen atom is substituted with a substituent, an aromatic hydrocarbon group having 6 to 12 carbon atoms or a substituted aromatic hydrocarbon group having 6 to 12 carbon atoms in which an arbitrary hydrogen atom is substituted with an alkyl group.

Examples of the aliphatic hydrocarbon group having 1 to 8 carbon atoms, the substituted aliphatic hydrocarbon group having 1 to 8 carbon atoms in which an arbitrary hydrogen atom is substituted with a substituent, the aromatic hydrocarbon group having 6 to 12 carbon atoms and the substituted aromatic hydrocarbon group having 6 to 12 carbon atoms in which an arbitrary hydrogen atom is substituted with an alkyl group, which are represented by $R^c$ in the Formula (II), include the same groups as those exemplified in the above for the aliphatic hydrocarbon group having 1 to 8 carbon atoms, the substituted aliphatic hydrocarbon group having 1 to 8 carbon atoms in which an arbitrary hydrogen atom is substituted with a substituent, the aromatic hydrocarbon group having 6 to 12 carbon atoms and the substituted aromatic hydrocarbon group having 6 to 12 carbon atoms in which an arbitrary hydrogen atom is substituted with an alkyl group, which are represented by $R^j$ and $R^k$ in the —$NR^jR^k$ group.

In the Formula (II), it is preferred that $R^a$s independently be a hydrogen atom, a methyl group, an ethyl group or a hydroxy group, and it is particularly preferred that $R^a$s independently be a hydrogen atom or a methyl group.

In the Formula (II), it is preferred that $R^b$s independently be a hydrogen atom, a methyl group, a hydroxy group, a —NH—C(O)—$CH_3$ group, a —N($CH_3$)—C(O)—$CH_3$ group or a —N($CH_3$)$_2$ group, and it is particularly preferred that $R^b$s independently be a hydrogen atom, a methyl group or a —NH—C(O)—$CH_3$ group.

In the Formula (II), it is preferred that $R^c$s independently be a hydrogen atom, an aliphatic hydrocarbon group having 1 to 8 carbon atoms, a cyclohexyl group, a methylbenzyl group or a —($CH_2$)$_2$—N($CH_3$)$_2$ group, and it is particularly preferred that $R^c$s independently be a hydrogen atom or a methyl group.

The compound (II) may also be a compound represented by the following Formula (II-1), which is a resonance structure thereof.

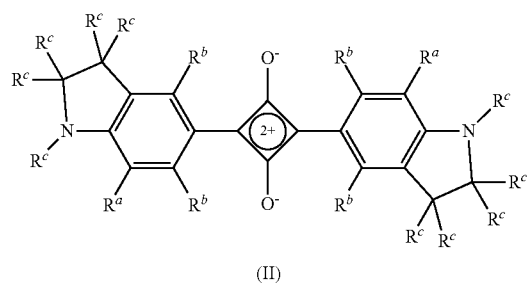
(II)
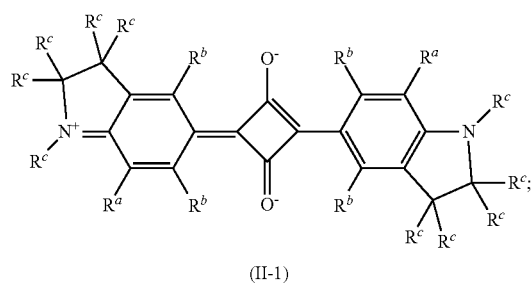
(II-1)
Examples of the above-described compound (II) include the following compounds (a-1) to (a-19). It is noted here that, in the following compounds, "Ac" represents —C(O)—CH₃.
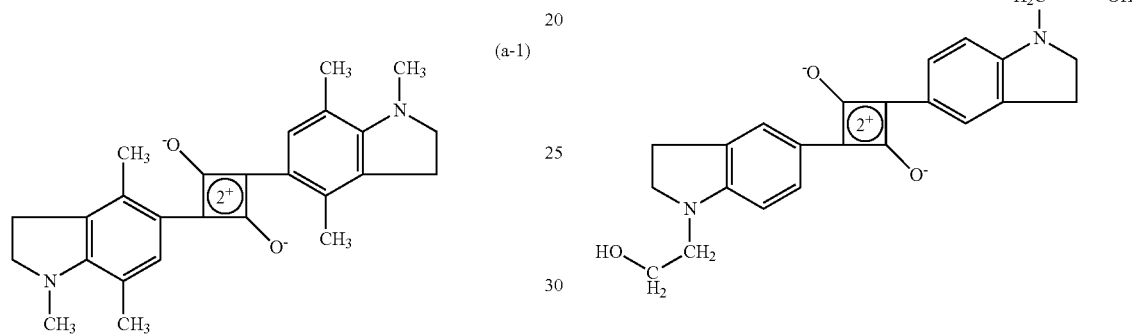
(a-1)
(a-4)
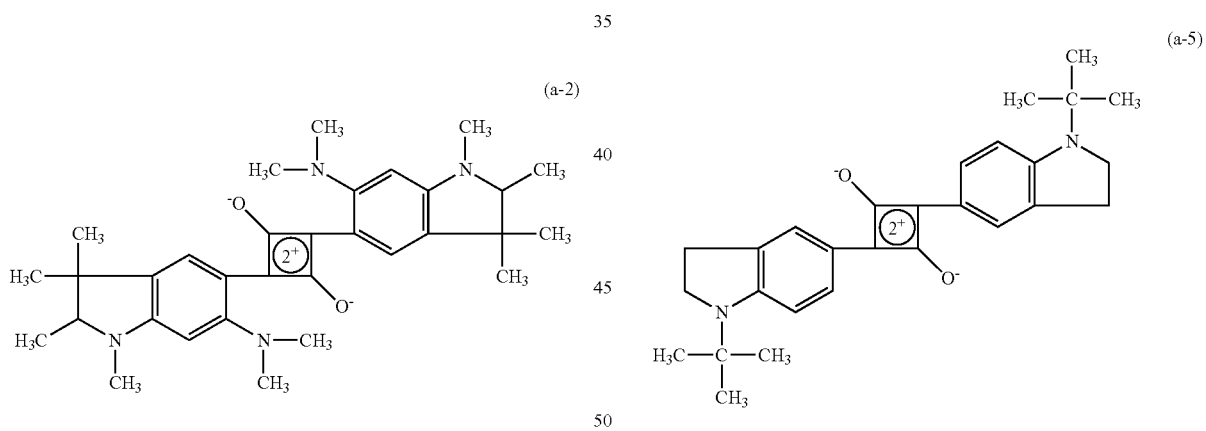
(a-2)
(a-5)
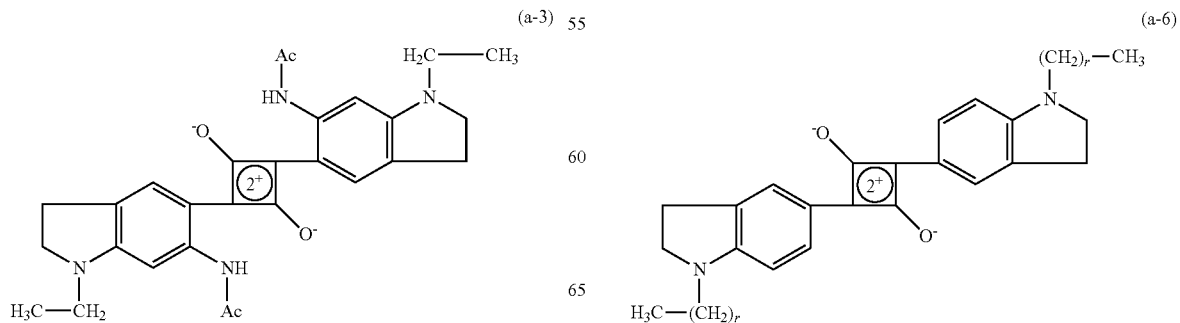
(a-3)
(a-6)

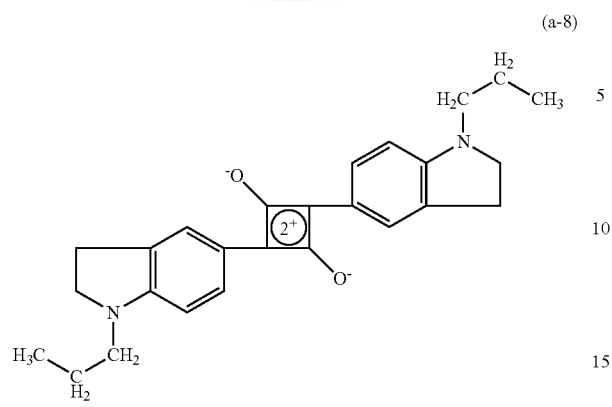
(a-8)
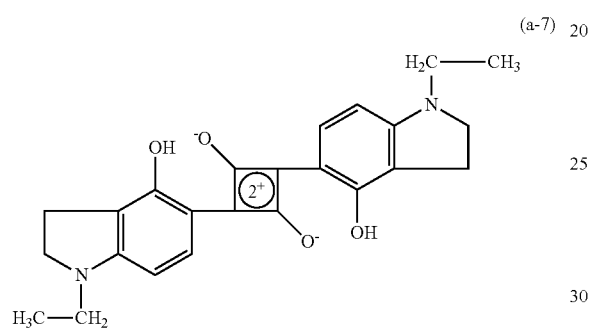
(a-7)
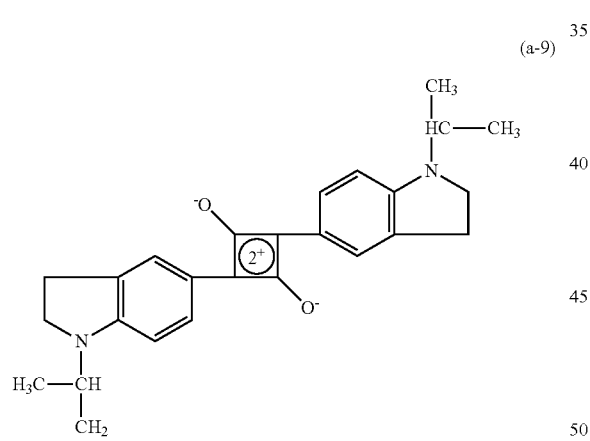
(a-9)
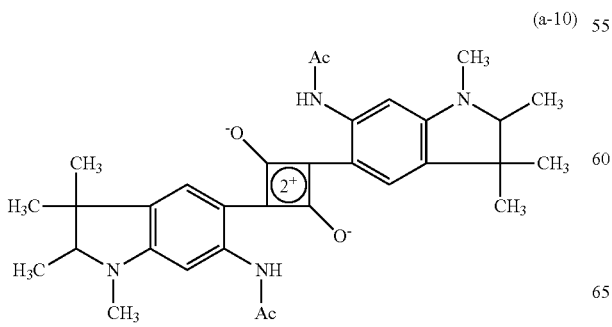
(a-10)
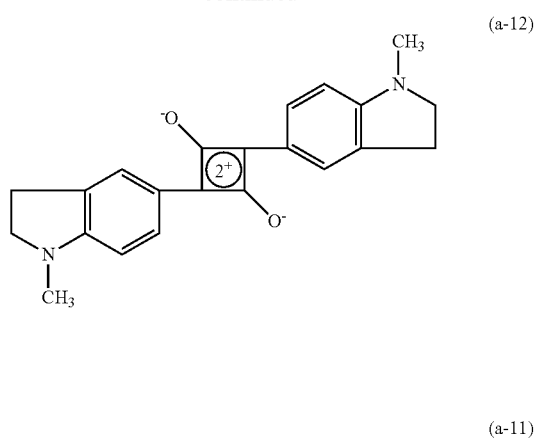
(a-12)
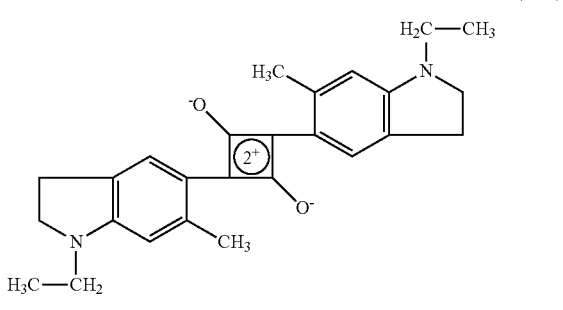
(a-11)
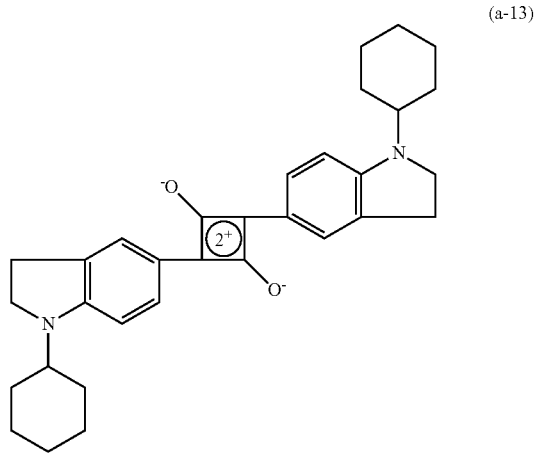
(a-13)
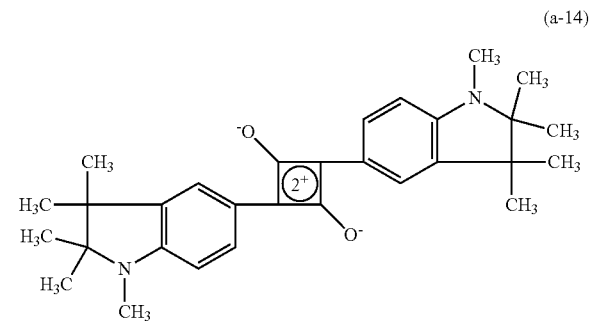
(a-14)

-continued (a-15)
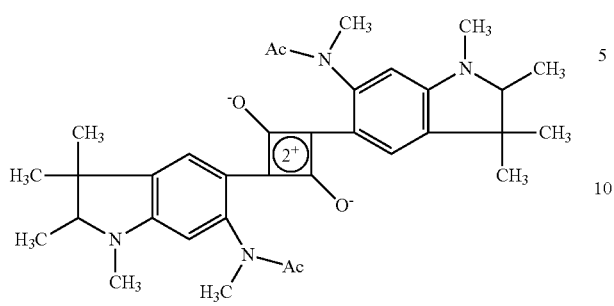

(a-16)
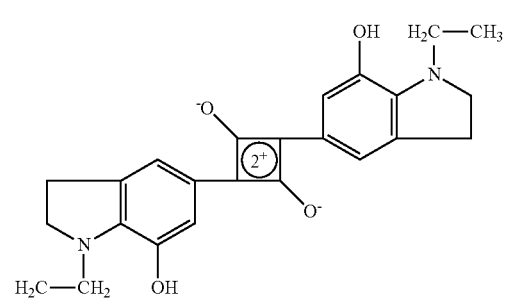

(a-17)
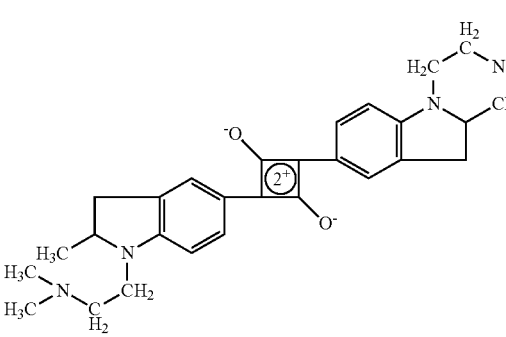

(a-18)
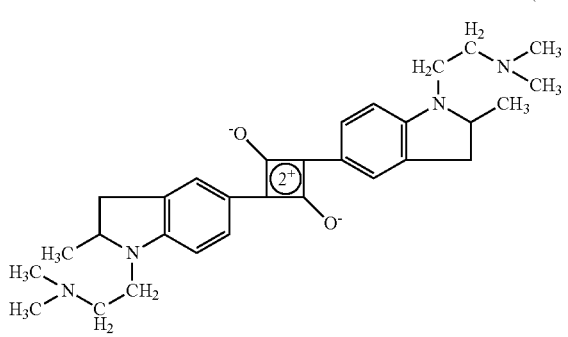

(a-19)
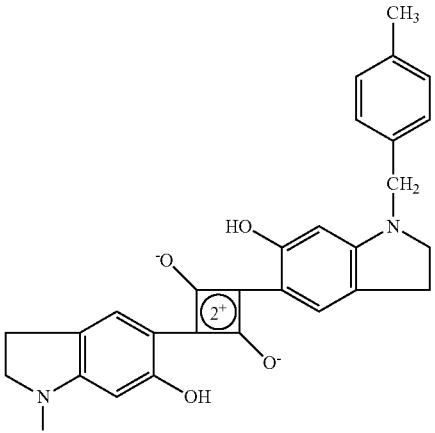

Among these compounds, the compound (a-10) dissolves well in methylene chloride and, when the spectral transmittance of a solution obtained by dissolving the compound (a-10) in methylene chloride at a concentration of 0.0001% by weight is measured (optical path length: 1 cm), the solution has an absorption maximum at a wavelength of 640 to 800 nm. In addition, when a resin substrate (I) of 0.1 mm in thickness, 60 mm in length and 60 mm in width is prepared by casting a solution having a resin concentration of 20% by weight, which is obtained by adding 0.01 parts by weight of the compound (a-10), 100 parts by weight a cyclic olefin-based resin ("ARTON G", manufactured by JSR Corporation) and methylene chloride, onto a smooth glass plate, drying the casted solution at 20° C. for 8 hours, detaching the resultant from the glass plate and then further drying the resultant under reduced pressure at 100° C. for 8 hour and the spectral transmittance of the thus obtained resin substrate (I) is measured, the transmittance of the resin substrate (I) at a wavelength of 640 nm, which is measured in the vertical direction, is 65% or higher. Therefore, the compound (a-10) is preferably used because a near-infrared cut filter which has a wide viewing angle and an absorption (transmission) wavelength with a small dependence on the incidence angle can be produced.

The light absorber (A) can be synthesized by a commonly-known method, such as the method described in JP-A-H1-228960.

In the present invention, the amount of the light absorber (A) to be used is preferably selected as appropriate such that the resin substrate satisfies the above-described (E) and (F). Specifically, the amount of the light absorber (A) is 0.001 to 0.01 parts by weight, preferably 0.003 to 0.01 parts by weight, more preferably 0.005 to 0.01 parts by weight, particularly preferably 0.007 to 0.01 parts by weight, with respect to 100 parts by weight of the resin used in the production of the resin substrate (I).

When the amount of the light absorber (A) is in the above-described range, a near-infrared cut filter which has high transmittance in the visible region, an absorption wavelength with a small dependence on the incidence angle, a wide viewing angle and as well as excellent near infrared-cutting capacity, transmittance in the wavelength range of 430 to 580 nm and excellent strength can be obtained.

When the amount of the light absorber (A) is greater than the above-described range, a near-infrared cut filter in which the characteristics (properties) of the light absorber (A) are more strongly expressed can be obtained in some cases; however, the transmittance in the range of 430 to 580 nm may be reduced to below a desired value and the strength of the resulting resin substrate and near-infrared cut filter may also be reduced. Meanwhile, when the amount of the light absorber (A) is smaller than the above-described range, a near-infrared cut filter having high transmittance in the range of 430 to 580 nm can be obtained in some cases; however, the characteristics of the light absorber (A) may not be expressed, making it difficult to obtain a resin substrate and a near-infrared cut filter which has an absorption wavelength with a small dependence on the incidence angle and a wide viewing angle.

In the near-infrared cut filter of the present invention, the light absorber (A) and (A') may be used individually, or two or more thereof may be used in combination.

<Resin>

The resin substrate used in the present invention may be any substrate as long as it contains the light absorber (A) or (A') and a resin. As the resin, a transparent resin is preferred. Such a resin is not particularly restricted unless it adversely affects the effects of the present invention and, for example, in order to ensure thermal stability and formability into a film and to obtain a film on which the below-described near infrared-reflecting film can be formed by high-temperature vapor deposition performed at a temperature of 100° C. or higher, it is desired that the resin be one which has a glass transition temperature (Tg) of preferably 110 to 380° C., more preferably 110 to 370° C., still more preferably 120 to 360° C. Further, when the glass transition temperature of the resin is 120° C. or higher, preferably 130° C. or higher, still more preferably 140° C. or higher, it is preferred from the viewpoint of obtaining a film on which a dielectric multi-layer film can be formed by vapor deposition at a higher temperature.

As the resin, it is desired to use a resin whose total light transmittance at a thickness of 0.1 mm is preferably 75 to 94%, more preferably 78 to 94%, particularly preferably 80 to 94%. When the total light transmittance is in this range, the resulting substrate shows good transparency.

Examples of such a resin include cyclic olefin-based resins, polyether-based resins, polyarylate resins (PAR), polysulfone resins (PSF), polyether sulfone resins (PES), poly-p-phenylene resins (PPP), polyarylene ether phosphine oxide resins (PEPO), polyimide resins (PPI), polyamide imide resins (PAI), (modified) acrylic resins, polycarbonate resins (PC), polyethylene naphthalates (PEN), allyl ester-based curable resins and silsesquioxane-based UV-curable resins.

Among the above-described resins, it is preferred to use a highly transparent resin such as a cyclic olefin-based resin or an aromatic polyether-based resin because particularly high transmittance can be attained in the visible region, and these resins are preferred because they have low hygroscopicity and are not likely to cause warping.

Further, particularly when a cyclic olefin-based resin or an aromatic polyether-based resin is used as the resin, since the above-described light absorbers (A) and (A') have good dispersibility in these resins, a substrate having uniform optical properties and excellent moldability can be obtained.

In the near-infrared cut filter of the present invention, these resins may be used individually, or two or more thereof may be used in combination.

<Cyclic Olefin-based Resin>

Examples of a transparent resin that may be used in the present invention include cyclic olefin-based resins. The cyclic olefin-based resin is not particularly restricted and, for example, a resin which is obtained by polymerizing at least one cyclic olefin-based monomer selected from the group consisting of monomers represented by the following Formula ($X_0$) and monomers represented by the following Formula ($Y_0$) or a resin which is obtained by further hydrogenating the resulting resin as required can be used.

The cyclic olefin-based monomers may be used individually, or two or more thereof may be used in combination.

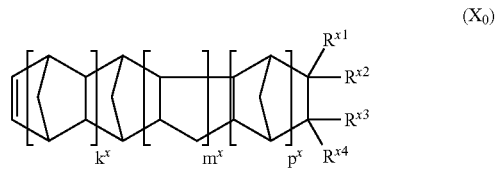

($X_0$)

(wherein, $R^{x1}$ to $R^{x4}$ each independently represent an atom or group selected from the following (i') to (ix'); and $k^x$, $m^x$ and $p^x$ each independently represent 0 or a positive integer)

(i') a hydrogen atom (ii') a halogen atom (iii') a trialkylsilyl group (iv') a substituted or non-substituted hydrocarbon group having 1 to 30 carbon atoms, which comprises a linking group containing an oxygen atom, a sulfur atom, a nitrogen atom or a silicon atom (v') a substituted or non-substituted hydrocarbon group having 1 to 30 carbon atoms (vi') a polar group (excluding (iv'))

(vii') $R^{x1}$ and $R^{x2}$ or $R^{x3}$ and $R^{x4}$ bind with each other to form an alkylidene group, and $R^{x1}$ to $R^{x4}$ that are not involved in the binding each independently represent an atom or group selected from the above-described (i') to (vi')

(viii') $R^{x1}$ and $R^{x2}$ or $R^{x3}$ and $R^{x4}$ bind with each other to form a monocyclic or polycyclic hydrocarbon ring or heterocycle, and $R^{x1}$ to $R^{x4}$ that are not involved in the binding each independently represent an atom or group selected from the above-described (i') to (vi')

(ix') $R^{x2}$ and $R^{x3}$ bind with each other to form a monocyclic hydrocarbon ring or heterocycle, and $R^{x1}$ and $R^{x4}$ that are not involved in the binding each independently represent an atom or group selected from the above-described (i') to (vi')

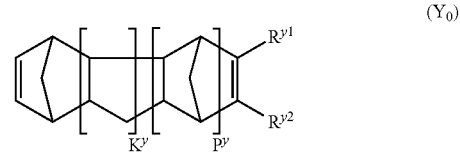

($Y_0$)

(wherein, $R^{y1}$ and $R^{y2}$ each independently represent an atom or group selected from the above-described (i') to (vi'), or the following (x'); and $K^y$ and $P^y$ each independently represent 0 or a positive integer)

(x') $R^{y1}$ and $R^{y2}$ bind with each other to form a monocyclic or polycyclic alicyclic hydrocarbon, aromatic hydrocarbon or heterocycle Examples of the (ii') halogen atom include a fluorine atom, a chlorine atom and a bromine atom.

The (iii') trialkylsilyl group is, for example, a trialkylsilyl group having 1 to 12 carbon atoms, preferably a trialkylsilyl group having 1 to 6 carbon atoms. Examples of such a trialkylsilyl group include a trimethylsilyl group, a triethylsilyl group and a triisopropylsilyl group.

Examples of the linking group containing an oxygen atom, a sulfur atom, a nitrogen atom or a silicon atom include carbonyl group (—CO—), an oxycarbonyl group (—OCO—), a carbonyloxy group (—COO—), a sulfonyl group (—SO$_2$—), an ether bond (—O—), a thioether bond (—S—), an imino group (—NH—), an amide bond (—NHCO—, —CONH—) and a siloxane bond (—OSi(R)$_2$— (wherein, R represents an alkyl group such as a methyl group or an ethyl group)). The (iv') substituted or non-substituted hydrocarbon group having 1 to 30 carbon atoms may contain a plurality of these linking groups.

Thereamong, from the standpoints of, for example, excellent adhesion with a near infrared-reflecting film and the dispersibility and solubility of the light absorber (A), a carbonyloxy group (*—COO—) and a siloxane bond (—OSi(R)$_2$—) are preferred. It is noted here that the asterisk "*" means binding to the ring of the Formula (X$_0$).

As the substituted or non-substituted hydrocarbon group having 1 to 30 carbon atoms, a substituted or non-substituted hydrocarbon group having 1 to 15 carbon atoms is preferred, and examples thereof include alkyl groups such as a methyl group, an ethyl group and a propyl group; cycloalkyl groups such as a cyclopentyl group and a cyclohexyl group; aromatic hydrocarbon groups such as a phenyl group, a biphenyl group and a phenylethyl group; and alkenyl groups such as a vinyl group, an allyl group and a propenyl group. Thereamong, a methyl group and an ethyl group are preferred because of thermal stability of the resin.

Examples of a substituent include a hydroxy group and a halogen atom.

Examples of the (vi') polar group include a hydroxy group; alkoxy groups having 1 to 10 carbon atoms, such as a methoxy group and an ethoxy group; carbonyloxy groups such as an acetoxy group, a propionyloxy group and a benzoyloxy group; a cyano group; an amino group; an acyl group; a sulfo group; and a carboxyl group.

Examples of the alkylidene group formed by binding between $R^{x1}$ and $R^{x2}$ or $R^{x3}$ and $R^{x4}$ include a methylidene group, an ethylidene group and a propylidene group.

Examples of the monocyclic or polycyclic hydrocarbon ring or heterocycle which is formed by binding between $R^{x1}$ and $R^{x2}$ or $R^{x3}$ and $R^{x4}$, the monocyclic hydrocarbon ring or heterocycle formed by binding between $R^{x2}$ and $R^{x3}$, or the monocyclic or polycyclic alicyclic hydrocarbon, aromatic hydrocarbon or heterocycle which is formed by binding between $R^{y1}$ and $R^{y2}$ include cyclopropylene, cyclobutylene, cyclopentylene, cyclohexylene, cycloheptylene, cyclobutenylene, cyclopentenylene, cyclohexenylene, phenylene and naphthylene.

It is preferred that $k^x$, $m^x$, $p^x$, $K^y$ and $p^y$ each independently be an integer of 0 to 3. Further, $k^x+m^x+p^x$ is more preferably an integer of 0 to 4, still more preferably an integer of 0 to 2, particularly preferably 1. $K^y+p^y$ is preferably an integer of 0 to 4, more preferably an integer of 0 to 2. When a cyclic olefin-based monomer in which $m^x$ is 0 and $k^x+p^x$ is 1 is used, it is preferred from the viewpoint of obtaining a resin having a high glass transition temperature and excellent mechanical strength.

The type and amount of the cyclic olefin-based monomer are selected as appropriate in accordance with the desired properties in the resulting resin.

When a compound which has a structure containing at least one atom of at least one kind selected from an oxygen atom, a sulfur atom, a nitrogen atom and a silicon atom (hereinafter, also referred to as "polar structure") in the molecule is used as the cyclic olefin-based monomer, there are advantages in that, for example, a resin having excellent dispersibility of the light absorber (A) and (A') can be obtained and a resin substrate having excellent adhesion with other materials (e.g., near infrared-reflecting film) can be obtained. Particularly, a resin which is obtained by polymerization of a compound wherein, in the above-described Formula (X$_0$), $R^{x1}$ and $R^{x3}$ are each independently a hydrogen atom or a hydrocarbon group having 1 to 3 carbon atoms, preferably a hydrogen atom or a methyl group, and either one of $R^{x2}$ and $R^{x4}$ is a group having a polar structure and the other is a hydrogen atom or a hydrocarbon group having 1 to 3 carbon atoms, has a low water (moisture)-absorbing property and is thus preferred. Further, a resin which is obtained by polymerization of a compound wherein either one of $R^{y1}$ and $R^{y2}$ is a group having a polar structure and the other is a hydrogen atom or a hydrocarbon group having 1 to 3 carbon atoms also has a low water (moisture)-absorbing property and is thus preferred. Moreover, a cyclic olefin-based monomer in which the group having a polar structure is a group represented by the following Formula (Z$_0$) is preferably used since it allows the balance between the heat resistance and water (moisture)-absorbing property of the resulting resin to be easily controlled.

$$—(CH_2)_z COOR \qquad (Z_0)$$

(wherein, R represents a substituted or non-substituted hydrocarbon group having 1 to 15 carbon atoms; and z represents 0 or an integer of 1 to 10)

In the Formula (Z$_0$), the smaller the value of z, the higher the glass transition temperature and the superior the heat resistance of the resulting hydrogenated polymer are; therefore, z is preferably 0 or an integer of 1 to 3, and a cyclic olefin-based monomer in which z is 0 is preferred because it can be easily synthesized.

Further, the larger the number of carbon atoms contained in the R of the Formula (Z$_0$), the more likely is the water (moisture)-absorbing property of the resulting hydrogenated polymer to be reduced; however, since the glass transition temperature of the polymer becomes also more likely to be lowered, from the standpoint of maintaining heat resistance, R is preferably a hydrocarbon group having 1 to 10 carbon atoms, particularly preferably a hydrocarbon group having 1 to 6 carbon atoms.

In the Formula (X$_0$), when an alkyl group having 1 to 3 carbon atoms, particularly a methyl group, is bound to the carbon atom to which a group represented by the Formula (Z$_0$) is bound, the compound tends to have a good balance between the heat resistance and the water (moisture)-absorbing property, which is preferred. In addition, a compound wherein, in the Formula (X$_0$), $m^x$ is 0 and $k^x+p^x$ is 1, is preferably used since it has a high reactivity and can produce a resin (polymer) with a high yield, and such a compound can yield a hydrogenated polymer having high heat resistance and is industrially easily obtainable.

The cyclic olefin-based resin may also be a polymer which is obtained by copolymerizing the cyclic olefin-based monomer and a monomer copolymerizable therewith in such a range which does not adversely affect the effects of the present invention.

Examples of these copolymerizable monomers include cyclic olefins such as cyclobutene, cyclopentene, cycloheptene, cyclooctene and cyclododecene; and unconjugated cyclic polyenes such as 1,4-cyclooctadiene, dicyclopentadiene and cyclododecatriene.

These copolymerizable monomers may be used individually, or two or more thereof may be used in combination.

The method of polymerizing the cyclic olefin-based monomer is not particularly restricted as long as it is capable of polymerizing monomers. For example, the cyclic olefin-based monomer can be polymerized by ring-opening polymerization or addition polymerization.

The resulting polymer of the ring-opening polymerization reaction has an olefinic unsaturated bond in its molecule. Further, the resulting polymer of the addition polymerization reaction may also have an olefinic unsaturated bond in its molecule. When an olefinic unsaturated bond exists in the polymer molecule in this manner, the olefinic unsaturated bond may cause coloration with time and deterioration such as gelation; therefore, it is preferred to carry out a hydrogenation reaction so as to convert the olefinic unsaturated bond into a saturated bond.

The hydrogenation reaction can be carried out by a conventional method, that is, by adding a known hydrogenation catalyst to a solution of polymer having an olefinic unsaturated bond and then allowing a hydrogen gas having a pressure of normal pressure to 300 atm, preferably 3 to 200 atm, to act on the resulting mixture at a temperature of 0 to 200° C., preferably 20 to 180° C.

The hydrogenation rate of the resulting hydrogenated polymer is, in terms of the rate at which hydrogen is added to the olefinic unsaturated bond, which is measured by $^1$H-NMR at 500 MHz, is usually 50% or higher, preferably 70% or higher, more preferably 90% or higher, particularly preferably 98% or higher, most preferably 99% or higher.

The higher the hydrogenation rate, the superior the stability of the resulting resin becomes against heat and light; therefore, by using such a resin, a resin substrate capable of maintaining stable properties over a prolonged period can be preferably obtained.

<Aromatic Polyether-based Resin>

Examples of a transparent resin that may be used in the present invention also include aromatic polyether-based resins. The term "aromatic polyether-based polymer" refers to a polymer which is obtained by a reaction that forms an ether bond in the main chain. The aromatic polyether-based resin is not particularly restricted; however, it is preferably a resin which has at least one structural unit (hereinafter, also referred to as "structural unit (1-2)") selected from the group consisting of a structural unit represented by the following Formula (1) (hereinafter, also referred to as "structural unit (1)") and a structural unit represented by the following Formula (2) (hereinafter, also referred to as "structural unit (2)") (hereinafter, such a resin is also referred to as "resin (1)"). A substrate obtained from such a resin (1) is excellent in heat resistance and mechanical strength as well as transparency, surface smoothness and the like.

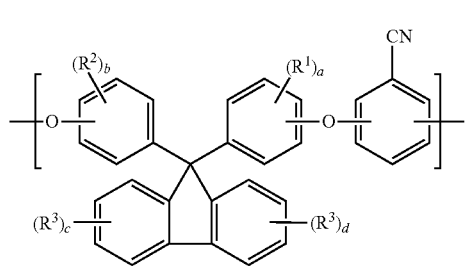

(1)

In the above-described Formula (I), $R^1$ to $R^4$ each independently represent a monovalent organic group having 1 to 12 carbon atoms.

In addition, a to d each independently represent an integer of 0 to 4, preferably 0 or 1.

Examples of the monovalent organic group having 1 to 12 carbon atoms include monovalent hydrocarbon groups having 1 to 12 carbon atoms; and monovalent organic groups having 1 to 12 carbon atoms which contain at least one atom selected from the group consisting of an oxygen atom and a nitrogen atom.

Examples of the monovalent hydrocarbon groups having 1 to 12 carbon atoms include linear or branched hydrocarbon groups having 1 to 12 carbon atoms, alicyclic hydrocarbon groups having 3 to 12 carbon atoms, and aromatic hydrocarbon groups having 6 to 12 carbon atoms.

The linear or branched hydrocarbon group having 1 to 12 carbon atoms is preferably a linear or branched hydrocarbon group having 1 to 8 carbon atoms, more preferably a linear or branched hydrocarbon group having 1 to 5 carbon atoms.

The alicyclic hydrocarbon group having 3 to 12 carbon atoms is preferably an alicyclic hydrocarbon group having 3 to 8 carbon atoms, more preferably an alicyclic hydrocarbon group having 3 or 4 carbon atoms.

Examples of an organic group having 1 to 12 carbon atoms which contains an oxygen atom include organic groups composed of a hydrogen atom(s), a carbon atom(s) and an oxygen atom(s) and, thereamong, for example, organic groups having a total of 1 to 12 carbon atoms that are composed of an ether bond(s), a carbonyl group(s) or an ester bond(s) and a hydrocarbon group(s) are preferred.

Examples of an organic group having 1 to 12 carbon atoms which contains a nitrogen atom include organic groups composed of a hydrogen atom(s), a carbon atom(s) and a nitrogen atom(s), and specific examples thereof include a cyano group, an imidazole group, a triazole group, a benzimidazole group and a benzotriazole group.

Examples of an organic group having 1 to 12 carbon atoms which contains both an oxygen atom and a nitrogen atom include organic groups composed of a hydrogen atom(s), a carbon atom(s), an oxygen atom(s) and a nitrogen atom(s), and specific examples thereof include an oxazole group, an oxadiazole group, a benzoxazole group and benzoxadiazole group.

As $R^1$ to $R^4$ in the Formula (1), from the standpoint of, for example, obtaining a resin having a low water (moisture)-absorbing property, a monovalent hydrocarbon group having 1 to 12 carbon atoms is preferred, an aromatic hydrocarbon group having 6 to 12 carbon atoms is more preferred, and a phenyl group is still more preferred.

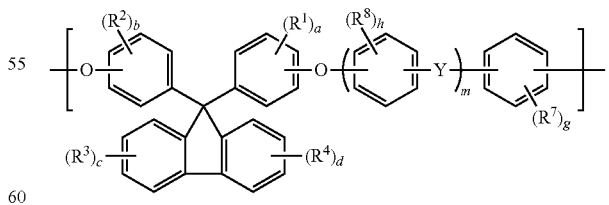

(2)

In the Formula (2), $R^1$ to $R^4$ and a to d each independently have the same meaning as in the Formula (1); Y represents a single bond, —SO$_2$— or >C=O; $R^7$ and $R^8$ each independently represent a halogen atom, a monovalent organic group having 1 to 12 carbon atoms or a nitro group; and m represents 0 or 1. It is noted here, however, that $R^7$ is not a cyano group when m is 0. Further, g and h each independently represent an integer of 0 to 4, preferably 0.

Examples of the monovalent organic group having 1 to 12 carbon atoms include the same organic groups as those exemplified for the monovalent organic group having 1 to 12 carbon atoms in the Formula (1).

In the resin (1), from the standpoints of the optical properties, heat resistance and mechanical properties, the molar ratio of the structural units (1) and (2) (provided that the sum of these structural units (structural unit (1)+structural unit (2)) is 100), structural unit (1):structural unit (2), is preferably 50:50 to 100:0, more preferably 70:30 to 100:0, still more preferably 80:20 to 100:0.

The term "mechanical properties" used herein referred to refers to the properties of a resin, such as tensile strength, elongation at break and tensile elastic modulus.

Further, the resin (1) may also have at least one structural unit (hereinafter, also referred to as "structural unit (3-4)") selected from the group consisting of a structural unit represented by the following Formula (3) and a structural unit represented by the following Formula (4). When the resin (1) has such a structural unit (3-4), the mechanical properties of a substrate containing the resin (1) are preferably improved.

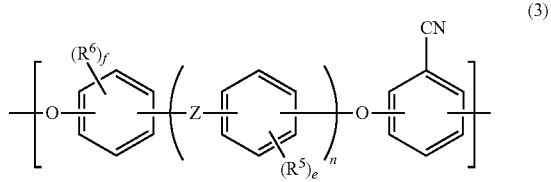

(3)

In the Formula (3), $R^5$ and $R^6$ each independently represent a monovalent organic group having 1 to 12 carbon atoms; Z represents a single bond, —O—, —S—, —SO$_2$—, >C=O, —CONH—, —COO— or a divalent organic group having 1 to 12 carbon atoms; and n represents 0 or 1. Further, e and f each independently represent an integer of 0 to 4, preferably 0.

Examples of the monovalent organic group having 1 to 12 carbon atoms include the same organic groups as those exemplified for the monovalent organic group having 1 to 12 carbon atoms in the Formula (1).

Examples of the divalent organic group having 1 to 12 carbon atoms include divalent hydrocarbon groups having 1 to 12 carbon atoms, divalent halogenated hydrocarbon groups having 1 to 12 carbon atoms, divalent organic groups having 1 to 12 carbon atoms which contain at least one atom selected from the group consisting of an oxygen atom and a nitrogen atom, and divalent halogenated organic groups having 1 to 12 carbon atoms which contain at least one atom selected from the group consisting of an oxygen atom and a nitrogen atom.

Examples of the divalent hydrocarbon groups having 1 to 12 carbon atoms include linear or branched divalent hydrocarbon groups having 1 to 12 carbon atoms, divalent alicyclic hydrocarbon groups having 3 to 12 carbon atoms and divalent aromatic hydrocarbon groups having 6 to 12 carbon atoms.

Examples of the divalent halogenated hydrocarbon groups having 1 to 12 carbon atoms include those groups in which at least one hydrogen atom of the divalent hydrocarbon group having 1 to 12 carbon atoms are substituted with a fluorine atom, a chlorine atom, a bromine atom or an iodine atom.

Examples of the organic groups having 1 to 12 carbon atoms which contain at least one atom selected from the group consisting of an oxygen atom and a nitrogen atom include organic groups composed of a hydrogen atom(s), a carbon atom(s), an oxygen atom(s) and/or a nitrogen atom(s); and divalent organic groups having a total of 1 to 12 carbon atoms that contain an ether bond(s), a carbonyl group(s), an ester bond(s) or an amide bond(s) and a hydrocarbon group(s).

Examples of the divalent halogenated organic groups having 1 to 12 carbon atoms which contain at least one atom selected from the group consisting of an oxygen atom and a nitrogen atom include those groups in which at least one hydrogen atom of the divalent organic group having 1 to 12 carbon atoms which contain at least one atom selected from the group consisting of an oxygen atom and a nitrogen atom are substituted with a fluorine atom, a chlorine atom, a bromine atom or an iodine atom.

It is preferred that Z in the Formula (3) be a single bond, —O—, —SO$_2$—, >C=O or a divalent organic group having 1 to 12 carbon atoms and, from the standpoint of, for example, obtaining a resin having a low water (moisture)-absorbing property, Z is more preferably a divalent hydrocarbon group having 1 to 12 carbon atoms. The divalent hydrocarbon group having 1 to 12 carbon atoms is more preferably a divalent alicyclic hydrocarbon group having 3 to 12 carbon atoms.

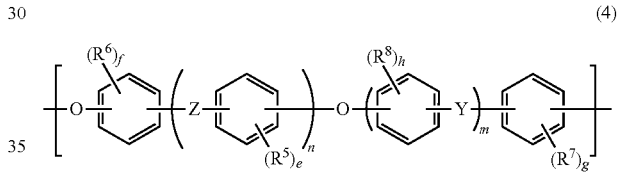

(4)

In the Formula (4), $R^7$, $R^8$, Y, m, g and h each independently have the same meaning as in the Formula (2); and $R^5$, $R^6$, Z, n, e and f each independently have the same meaning as in the Formula (3). It is noted here that, when m is 0, $R^7$ is not a cyano group.

In the resin (1), from the standpoints of the optical properties, heat resistance and mechanical properties, the molar ratio of the structural units (1-2) and (3-4) (provided that the sum of these structural units (structural unit (1-2)+ structural unit (3-4)) is 100), structural unit (1-2):structural unit (3-4), is preferably 50:50 to 100:0, more preferably 70:30 to 100:0, still more preferably 80:20 to 100:0.

From the standpoints of the optical properties, heat resistance and mechanical properties, the resin (1) contains the structural units (1-2) and (3-4) in an amount of preferably not less than 70 mol %, preferably not less than 95 mol %, with respect to the total amount of all structural units.

The resin (1) can be obtained by, for example, allowing a component which contains at least one compound selected from the group consisting of a compound represented by the following Formula (5) (hereinafter, also referred to as "compound (5)") and a compound represented by the following Formula (7) (hereinafter, also referred to as "compound (7)") (hereinafter, such a component is also referred to as "component (A)") to react with a component which contains a compound represented by the following Formula (6) (hereinafter, also referred to as "compound (6)") (hereinafter, such a component is also referred to as "component (B)").

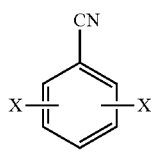

(5)

In the Formula (5), Xs independently represent a halogen atom, preferably a fluorine atom.

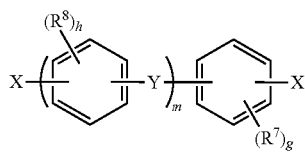

(7)

In the Formula (7), $R^7$, $R^8$, Y, m, g and h each independently have the same meaning as in the Formula (2); and Xs independently have the same meaning as in the Formula (5). It is noted here, however, that $R^7$ is not a cyano group when m is 0.

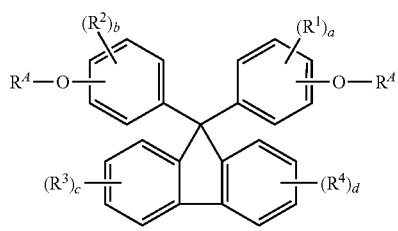

(6)

In the Formula (6), $R^4$s each independently represent a hydrogen atom, a methyl group, an ethyl group, an acetyl group, a methanesulfonyl group or a trifluoromethylsulfonyl group. Thereamong, a hydrogen atom is preferred. In the Formula (6), $R^1$ to $R^4$ and a to d each independently have the same meaning as in the Formula (1).

In 100 mol % of the component (A), the compound which is at least one compound selected from the group consisting of the compound (5) and the compound (7) is contained in an amount of preferably 80 mol % to 100 mol %, more preferably 90 mol % to 100 mol %.

Further, it is preferred that the component (B) also contain, as required, a compound represented by the following Formula (8). In 100 mol % of the component (B), the compound (6) is contained in an amount of preferably 50 mol % to 100 mol %, more preferably 80 mol % to 100 mol %, still more preferably 90 mol % to 100 mol %.

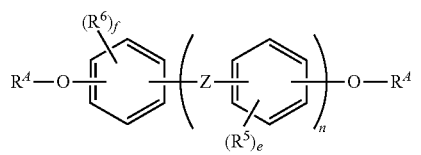

(8)

In the Formula (8), $R^5$, $R^6$, Z, n, e and f each independently have the same meaning as in the Formula (3); and $R^4$s independently have the same meaning as in the Formula (6).

These compounds (5) to (8) that may be used in the synthesis of the resin (1) may be used individually, or two or more thereof may be used in combination.

<Commercially Available Transparent Resins>

Examples of commercial-available transparent resins that can be used in the present invention include the following commercial products. Examples of commercial products of cyclic olefin-based resin include ARTON manufactured by JSR Corporation, ZEONOR manufactured by ZEON Corporation, APEL manufactured by Mitsui Chemicals, Inc. and TOPAS manufactured by Polyplastics Co., Ltd. Examples of commercial products of polyether sulfone resin include SUMIKA EXCEL PES manufactured by Sumitomo Chemical Co., Ltd. and SUMILITE manufactured by Sumitomo Bakelite Co., Ltd. Examples of commercial products of polyimide resin include NEOPRIM L manufactured by Mitsubishi Gas Chemical Company, Inc. Examples of commercial products of polycarbonate resin include PURE-ACE manufactured by TEIJIN Ltd. Examples of commercial products of silsesquioxane-based UV-curable resin include SILPLUS manufactured by Nippon Steel Chemical Co., Ltd.

<Other Components>

In the resin substrate, additives such as an antioxidant; an ultraviolet absorber; a near infrared-absorbing dye or pigment other than the light absorber (A); a coating agent such as a reflection inhibitor, a hard-coat agent or an antistatic agent; and a metal complex-based compound can be further added within a range which does not adversely affect the effects of the present invention. In addition, in cases where a resin substrate is produced by the below-described solution casting method, the resin substrate can be easily produced with an addition of a leveling agent and/or an antifoaming agent. These other components may be used individually, or two or more thereof may be used in combination.

Examples of the antioxidant include 2,6-di-t-butyl-4-methylphenol, 2,2'-dioxy-3,3'-di-t-butyl-5,5'-dimethyldiphenylmethane and tetrakis[methylene-3-(3,5-di-t-butyl-4-hydroxyphenyl)propionate]methane.

Examples of the ultraviolet absorber include 2,4-dihydroxybenzophenone and 2-hydroxy-4-methoxybenzophenone.

It is noted here that these additives may be mixed with a resin and the like when producing a resin substrate, or may be added when a resin is produced. Further, although the amount of additive(s) to be added is selected as appropriate in accordance with the desired property, it is normally 0.01 to 5.0 parts by weight, preferably 0.05 to 2.0 parts by weight, with respect to 100 parts by weight of a resin.

<Method of Producing Resin Substrate>

The resin substrate used in the present invention can be produced by, for example, melt-molding or cast-molding of a composition comprising a resin and a light absorber (A) or (A').

(A) Melt-molding

The resin substrate can be produced by, for example, a method in which a pellet obtained by melt-kneading the above-described resin and light absorber (A) or (A') is melt-molded; a method in which a resin composition containing the above-described resin and light absorber (A) or (A') is melt-molded; or a method in which a pellet obtained by removing a solvent from a resin composition containing the light absorber (A) or (A'), the above-described resin and a solvent is melt-molded. Examples of melt-molding method include injection molding, melt-extrusion molding and blow molding.

(B) Cast-molding

The a resin substrate can also be produced by, for example, casting a resin composition containing the absorber (A) or (A'), the above-described resin and a solvent on an appropriate base material and then removing the solvent; casting a resin composition containing a coating agent(s), such as a reflection inhibitor, a hard-coat agent and/or an antistatic agent, the light absorber (A) or (A') and the above-described resin on an appropriate base material; or casting a curable composition containing a coating agent(s), such as a reflection inhibitor, a hard-coat agent and/or an antistatic agent, the light absorber (A) or (A') and the above-described resin on an appropriate base material and then curing and drying the casted composition.

Examples of the base material include a glass plate, a steel belt, a steel drum and a transparent resin (e.g., a polyester film, a cyclic olefin-based resin film).

The resin substrate can be obtained by removing a coating film from such a base material. Alternatively, as long as the effects of the present invention are not adversely affected, a laminate of such a base material and a coating film may also be used as the above-described resin substrate without removing the coating film from the base material.

Further, the resin substrate can also be formed directly on an optical component by coating an optical component made of a glass plate, quartz, transparent plastic or the like with the resin composition and then drying the solvent, or by coating, and then curing, drying or the like the curable composition on such an optical component.

The amount of residual solvent in a resin substrate obtained by the above-described method is preferably as small as possible and it is usually not more than 3% by weight, preferably not more than 1% by weight, more preferably not more than 0.5% by weight. When the amount of residual solvent is in the above-described range, a resin substrate in which deformation and changes in the properties are not likely to occur and a desired function can be easily exerted can be obtained.

<<Near Infrared-reflecting Film>>

The near infrared-reflecting film used in the present invention is a film having an ability to reflect near-infrared ray. As such a near infrared-reflecting film, for example, an aluminum vapor-deposited film, a noble metal thin film, a resin film in which metal oxide particles containing indium oxide as a main component and a small amount of tin oxide are dispersed, or a dielectric multilayer film in which a high-refractive-index material layer and a low-refractive-index material layer are alternately stacked can be employed.

By incorporating such a near infrared-reflecting film, the near-infrared cut filter of the present invention is made to have the following feature (C) in particular. By this, a filter capable of sufficiently cutting near-infrared ray can be obtained.

In the present invention, a near infrared-reflecting film may be arranged on one side of a resin substrate, or it may be arranged on both sides of a resin substrate. When a near infrared-reflecting film is arranged on one side of a resin substrate, excellent production cost and ease of production are attained, while when a near infrared-reflecting film is arranged on both sides of a resin substrate, a near-infrared cut filter which has a high strength and is not likely to suffer warping can be obtained.

Among the near infrared-reflecting films, a dielectric multilayer film in which a high-refractive-index material layer and a low-refractive-index material layer are alternately stacked can be suitably used.

As a material constituting the high-refractive-index material layer, a material having a refractive index of 1.7 or higher can be used, and a material having a refractive index in the range of 1.7 to 2.5 is preferably selected.

Examples of such a material include those materials which contain titanium oxide, zirconium oxide, tantalum pentoxide, niobium pentoxide, lanthanum oxide, yttrium oxide, zinc oxide, zinc sulfide, indium oxide or the like as a main component and titanium oxide, tin oxide and/or cerium oxide in a small amount (for example, 0 to 10% with respect to the main component).

As a material constituting the low-refractive-index material layer, a material having a refractive index of 1.6 or lower can be used, and a material having a refractive index in the range of 1.2 to 1.6 is preferably selected.

Examples of such a material include silica, alumina, lanthanum fluoride, magnesium fluoride and sodium hexafluoroaluminate.

The method of stacking a high-refractive-index material layer and a low-refractive-index material layer is not particularly restricted as long as it forms a dielectric multilayer film in which these material layers are stacked. For example, a dielectric multilayer film in which a high-refractive-index material layer and a low-refractive-index material layer are alternately stacked can be directly formed on the resin substrate by a CVD method, a sputtering method, a vacuum-deposition method, an ion-assisted vapor-deposition method, an ion-plating method or the like.

Further, in order to improve the adhesion between a resin substrate and a near infrared-reflecting film, the resin substrate may also be subjected to a surface treatment such as corona treatment or plasma treatment.

It is preferred that each of these high-refractive-index material layer and low-refractive-index material layer normally have a thickness of $0.1\ \lambda$ to $0.5\ \lambda$, taking the wavelength of the near-infrared ray to be blocked as $\lambda$ (nm). When the thicknesses of these layers are in this range, the optical film thickness, which is a thickness that a product of refractive index (n) and film thickness (d) (n×d) is $\lambda/4$, is substantially the same as the thickness of each of the high-refractive-index material layer and the low-refractive index material layer, so that blockage and transmission of a specific wavelength tends to become easily controllable based on the relationships in the optical properties of reflection and refraction.

However, in cases where a slight reflection is observed in the visible region (wavelength: 420 to 700 nm), in order to reduce the reflectance, several layers having a thickness outside of the range of $0.1\ \lambda$ to $0.5\ \lambda$ may also be added. In this case, it is preferred that the added layers have a thickness of $0.03\ \lambda$ to $0.1\ \lambda$.

In a dielectric multilayer film, it is desired that the total number of the high-refractive-index material layers and the low-refractive-index material layers be 5 to 60, preferably 10 to 50.

Further, in cases where the substrate is warped when a dielectric multilayer film is formed thereon, in order to resolve this problem, for example, a method of forming a dielectric multilayer film on both sides of the substrate or a method of irradiating the surface on which a dielectric multilayer film is formed with electromagnetic radiation such as UV radiation can be employed. Here, in cases where electromagnetic irradiation is performed, the substrate may be irradiated during the formation of a dielectric multilayer film, or the substrate may be separately irradiated after the completion of the formation.

<<Other Functional Films>>

In the near-infrared cut filter of the present invention, between a resin substrate and a near infrared-reflecting film such as a dielectric multilayer film, on the surface of a resin substrate opposite to the surface on which a near infrared-reflecting film is arranged or on the surface of a near infrared-reflecting film opposite to the surface on which a resin substrate is arranged, for the purpose of, for example, improving the surface hardness of the resin substrate and near infrared-reflecting film, improving their chemical resistance, providing antistatic property and preventing damages, a functional film such as an anti-reflection film, a hard coat film or an antistatic film can be provided as appropriate in such a manner that the effects of the present invention are not adversely affected.

The near-infrared cut filter of the present invention may comprise one or more layers composed of the functional films. In cases where the near-infrared cut filter of the present invention comprises two or more layers that are composed of the functional films, the two or more layers may be the same or different.

The method of laminating a functional film is not particularly restricted, and examples thereof include those methods in which, for example, a coating agent(s) such as a reflection inhibitor, a hard-coat agent and/or an antistatic agent is/are melt-molded or cast-molded on a resin substrate or near infrared-reflecting film in the same manner as described above.

Further, a functional film can also be produced by applying a curable composition containing the coating agent(s) and the like on a resin substrate or near infrared-reflecting film using a bar coater or the like and then curing the thus coated curable composition by UV irradiation or the like.

Examples of the coating agent include ultraviolet (UV)/electron beam (EB)-curable resins and thermosetting resins, specifically, urethane-based, urethane acrylate-based, acrylate-based, epoxy-based and epoxy acrylate-based resins.

Further, the curable composition may also contain a polymerization initiator. As the polymerization initiator, any known photopolymerization initiator or heat polymerization initiator can be used, and a photopolymerization initiator and a heat polymerization initiator may be used in combination as well. Such polymerization initiators may be used individually, or two or more thereof may be used in combination.

In the curable composition, the blending ratio of the polymerization initiator(s) is preferably 0.1 to 10% by weight, more preferably 0.5 to 10% by weight, still more preferably 1 to 5% by weight, taking the total amount of the curable composition as 100% by weight. When the blending ratio of the polymerization initiator(s) is in the above-described range, the curable composition has excellent curability and ease of handling and can thus yield a functional film, such as an antireflection film, a hard coat film or an antistatic film, which has a desired hardness.

Further, in the curable composition, an organic solvent may also be added as a solvent. As the organic solvent, any known organic solvent can be used. Specific examples thereof include alcohols such as methanol, ethanol, isopropanol, butanol and octanol; ketones such as acetone, methyl ethyl ketone, methyl isobutyl ketone and cyclohexanone; esters such as ethyl acetate, butyl acetate, ethyl lactate, γ-butyrolactone, propylene glycol monomethyl ether acetate and propylene glycol monoethyl ether acetate; ethers such as ethylene glycol monomethyl ether and diethylene glycol monobutyl ether; aromatic hydrocarbons such as benzene, toluene and xylene; and amides such as dimethylformamide, dimethylacetamide and N-methylpyrrolidone.

These solvents may be used individually, or two or more thereof may be used in combination.

The thickness of the functional film is preferably 0.1 μm to 20 μm, more preferably 0.5 μm to 10 μm, particularly preferably 0.7 μm to 5 μm.

Further, in order to improve the adhesion between a resin substrate and a functional film and/or a near infrared-reflecting film or between a functional film and a near infrared-reflecting film, the resin substrate and/or the functional film may also be subjected to a surface treatment such as corona treatment or plasma treatment.

<<Properties, Etc. Of Near-infrared Cut Filter>>

In the near-infrared cut filter of the present invention, it is preferred that its light transmittance satisfy the following (A) to (D).

(A) In a wavelength range of 430 to 580 nm, it is desired that the average transmittance measured in the vertical direction of the near-infrared cut filter be 80% or higher, preferably 82% or higher, more preferably 85% or higher. In the present invention, by using, for example, a resin having a high total light transmittance at a thickness of 0.1 mm and a light absorber (A) or (A') which does not show absorption in this wavelength range, such a near-infrared cut filter that has high transmittance in the wavelength range of 430 to 580 nm can be obtained.

In cases where the near-infrared cut filter is used as a spectral luminous efficacy correction filter or the like in a lens unit such as a solid-state imaging device or a camera module, it is preferred that, in the wavelength range of 430 to 580 nm, the average transmittance be in the above-described range and the transmittance be substantially constant.

The higher the average transmittance in the wavelength range of 430 to 580 nm, the more preferred it is. When this average transmittance is high, the intensity of the light passing through the filter is sufficiently maintained, so that the filter can be suitably used in, for example, the below-described applications.

On the other hand, when the average transmittance in the wavelength range of 430 to 580 nm is low, the intensity of the light passing through the filter may not be sufficiently maintained, so that the filter may not be suitably used in the below-described applications.

(B) In a wavelength range of 630 to 650 nm, it is desired that the average transmittance measured in the vertical direction of the near-infrared cut filter be 70% or higher, preferably 75% or higher, more preferably 78% or higher. In the present invention, particularly by using the light absorber (A), a near-infrared cut filter having a prescribed transmittance can be obtained.

When the transmittance of the near-infrared cut filter in the wavelength range of 630 to 650 nm is in the above-described range, a near-infrared cut filter having high transmittance in the visible region, in which the transmittance changes abruptly at a wavelength around the near-infrared wavelength region when light comes into the filter, can be obtained.

(C) In a wavelength range of 800 to 1,000 nm, it is desired that the average transmittance measured in the vertical direction of the near-infrared cut filter be 20% or lower, preferably 15% or lower, more preferably 10% or lower. In the present invention, by arranging a near infrared-reflecting film on a resin substrate, such a near-infrared cut filter that has a sufficiently low transmittance in the wavelength range of 800 to 1,000 nm can be obtained.

Particularly, by arranging a near infrared-reflecting film having a high ability to reflect near-infrared ray, such as the above-described dielectric multilayer film, on the resin substrate (I), a near-infrared cut filter having a sufficiently low transmittance in the wavelength range of 800 to 1,000 nm can be obtained.

Since the near-infrared cut filter of the present invention selectively reduces the wavelength of near-infrared ray (800 nm or longer), the lower the average transmittance in the wavelength range of 800 to 1,000 nm, the more preferred it is. When this average transmittance is low, the near-infrared cut filter can sufficiently cut near-infrared ray.

On the other hand, when the average transmittance in the wavelength range of 800 to 1,000 nm is high, the filter cannot sufficiently cut near-infrared ray; therefore, when the filter is used in a PDP or the like, malfunction of electronics around the PDP in a home setting may not be able to be prevented.

(D) In a wavelength range of 550 to 700 nm, it is desired that the absolute value of the difference between the value of the wavelength at which the transmittance measured in the vertical direction of the near-infrared cut filter is 75% (Ya) and the value of the wavelength at which the transmittance measured at an angle of 30° with respect to the vertical direction of the near-infrared cut filter is 75% (Yb), |Ya−Yb|, be less than 15 nm, preferably less than 10 nm, more preferably less than 8 nm.

In the present invention, by using the light absorber (A), a near-infrared cut filter in which the absolute value of the difference between the wavelengths at which the transmittance becomes a prescribed value is in the above-described prescribed range can be obtained.

When the absolute value of the difference between (Ya) and (Yb) in the wavelength range of 550 to 700 nm is in the above-described range, by using such a filter in a digital camera or the like, the digital camera or the like which shows equivalent brightness and color in both the periphery and the center of the resulting image and has a wide viewing angle can be obtained.

On the other hand, when a near-infrared cut filter in which the absolute value of the difference between (Ya) and (Yb) is 15 nm or greater is used in a digital camera or the like, the digital camera or the like may produce an image having different brightness and color between the periphery and the center and a specific color may be difficult to see in the image. Therefore, such a near-infrared cut filter may not be suitably used in the below-described applications.

In the present invention, when light is allowed to enter a near-infrared cut filter vertically and horizontally, "viewing angle" may also be used as an index to show up to which angle the filter can allow the light to transmit therethrough in a normal fashion.

In the present invention, as a criterion for judging if a filter can allow light to transmit therethrough in a normal fashion, whether or not the absolute value of the difference between the value of the wavelength at which the transmittance measured in the vertical direction of the filter is 75% (Ya) and the value of the wavelength at which the transmittance measured at an angle of 30° with respect to the vertical direction of the filter is 75% (Yb) is less than 15 nm in the wavelength range of 550 to 700 nm is used.

It is preferred that the thickness of the near-infrared cut filter be adjusted such that the transmittance thereof satisfies the above-described (A) to (D). The thickness of the near-infrared cut filter is not particularly restricted; however, it is preferably 50 to 250 μm, more preferably 50 to 200 μm, still more preferably 80 to 150 μm.

When the thickness of the near-infrared cut filter is in the above-described range, the filter can be downsized and light-weighted, and it can be suitably used in a variety of applications such as a solid-state imaging device. Particularly, when the filter is used in a lens unit such as a camera module, it is preferred from the viewpoint that the lens unit can be made to have a low profile.

<Application of Near-infrared Cut Filter>

The near-infrared cut filter of the present invention has for example, a wide viewing angle and excellent near infrared-cutting capacity. Therefore, it is useful as a spectral luminous efficacy correction filter of a solid-state imaging sensing element such as CCD or CMOS image sensor of a camera module. More particularly, the near-infrared cut filter of the present invention is useful in solid-state imaging devices such as digital still cameras, cell phone cameras, digital video camcorders, PC cameras, surveillance cameras and vehicle cameras.

A case where a near-infrared cut filter obtained in the present invention is used in a camera module will now be described concretely.

FIG. 1 shows a cross-sectional schematic view of a camera module.

FIG. 1(a) is a cross-sectional schematic view showing the structure of a conventional camera module and FIG. 1(b) is a cross-sectional schematic view showing one of possible structures of a camera module in which a near-infrared cut filter 6' obtained in the present invention is used.

In FIG. 1(b), the near-infrared cut filter 6' obtained in the present invention is used above a lens 5; however, the near-infrared cut filter 6' can also be arranged between the lens 5 and a sensor 7.

In a conventional camera module, incoming light was required to enter a near-infrared cut filter 6 substantially perpendicularly thereto. Therefore, the filter 6 was required to be arranged between the lens 5 and the sensor 7.

Here, the sensor 7 is highly sensitive and may fail to properly operate due to mere contact with dust of about 5 μ in size; therefore, the filter 6 to be used above the sensor 7 was required to produce no dust and contain no foreign substance. In addition, because of the properties of the sensor 7, it was necessary to provide a prescribed gap between the filter 6 and the sensor 7, and this was one of the factors impeding low-profiling of the camera module.

In contrast, in the near-infrared cut filter 6' obtained in the present invention, the absolute value of the difference between (Ya) and (Yb) is 15 nm or smaller. That is, there is no large difference in the transmission wavelength between the light coming into the filter 6' in the vertical direction and the light coming into the filter 6' at an angle of 30° with respect to the vertical direction (the absorption (transmission) wavelength has a small dependence on the incidence angle); therefore, it is not required to arrange the filter 6' between the lens 5 and the sensor 7 and the filter 6' can thus be arranged above the lens as well.

Accordingly, when the near-infrared cut filter 6' obtained in the present invention is used in a camera module, the camera module has excellent ease of handling and, since it is not necessary to provide a prescribed gap between the filter 6' and the sensor 7, the camera module can be made to have a low profile.

EXAMPLES

The present invention will now be described by way of examples thereof; however, the present invention is not restricted thereto by any means. It is noted here that, unless otherwise specified, "part(s)" means "part(s) by weight".

First, the methods of measuring the values of the respective physical properties and the methods of evaluating the physical properties will be described.

(1) Molecular Weight:

The weight-average molecular weight (Mw) and number-average molecular weight (Mn) were measured based on standard polystyrene using a gel permeation chromatography (GPC) apparatus manufactured by Waters Corp. (model 150C), which was fitted with an H-type column manufactured by Tosoh Corporation. The measurement used o-dichlorobenzene solvent and the measurement temperature was 120° C.

(2) Glass Transition Temperature (Tg):

The glass transition temperature was measured using a differential scanning calorimeter manufactured by SII Nano-Technology Inc. (DSC6200) at a heating rate of 20° C./minute under nitrogen gas flow.

(3) Saturated Water Absorption:

In accordance with ASTM D570, a test piece of 3 mm in thickness, 50 mm in length and 50 mm in width was prepared from a resin produced in each Synthesis Example. After immersing the thus obtained test piece in 23° C. water for 1 week, the water absorption was measured based on the change in the weight of the test piece.

(4) Spectral Transmittance:

The spectral transmittance was measured using a spectrophotometer manufactured by Hitachi High-Technologies Corporation (U-4100).

Figure 2:
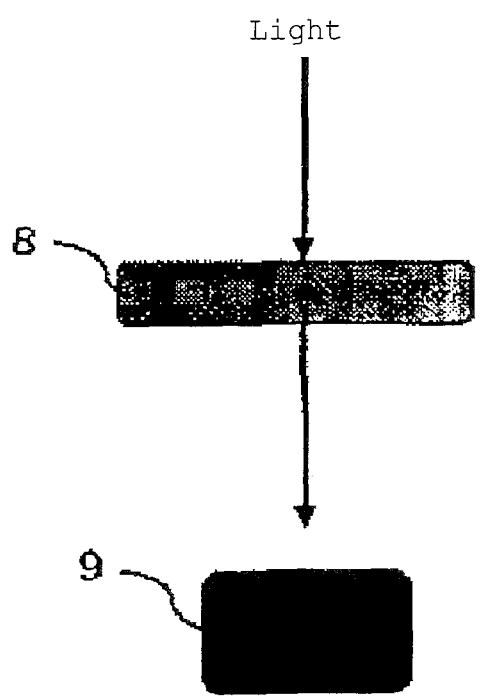
FIG. 2 is a schematic view showing a method of measuring the transmittance of a near-infrared cut filter in the vertical direction.

Here, as shown in FIG. 2, the transmittance of a near-infrared cut filter in the vertical direction was determined by measuring the light transmitting through the filter perpendicularly thereto.

Figure 3:
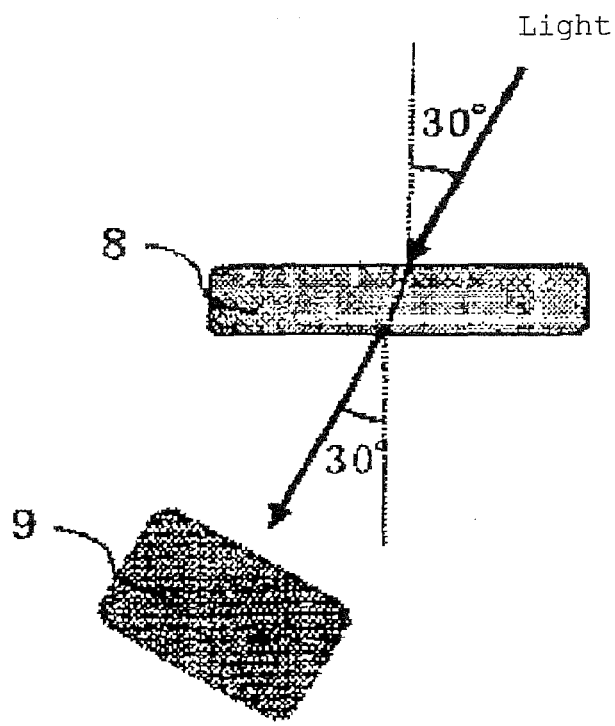
FIG. 3 is a schematic view showing a method of measuring the transmittance of a near-infrared cut filter at an angle of 30° with respect to the vertical direction.

Further, as shown in FIG. 3, the transmittance of a near-infrared cut filter at an angle of 30° with respect to the vertical direction was determined by measuring the light transmitting through the filter at an angle of 30° with respect to the vertical direction.

It is noted here that, in Examples, except for the measurement of (Yb), the spectral transmittance was measured using the above-described spectrophotometer under a condition in which the incidence angle of incoming light is perpendicular to the subject substrate and filter. The measurement of (Yb) was carried out using the same spectrophotometer under a condition in which the incidence angle of incoming light is 30° with respect to the vertical direction of the subject substrate and filter.

Synthesis Example 1

100 parts of 8-methyl-8-methoxycarbonyl tetracyclo [4.4.0.1$^{2,5}$.1$^{7,10}$]dodeca-3-ene represented by the following Formula (a) (hereinafter, also referred to as "DNM"), 18 parts of 1-hexene (molecular weight modifier) and 300 parts of toluene (solvent for ring-opening polymerization reaction) were loaded to a reaction vessel whose atmosphere had been replaced with nitrogen and this solution was heated to 80° C. Then, to the solution in the reaction vessel, as polymerization catalysts, 0.2 parts of a toluene solution of triethyl aluminum (0.6 mol/L) and 0.9 parts of a toluene solution of methanol-modified tungsten hexachloride (concentration: 0.025 mol/L) were added and the resulting solution was heated with stirring at 80° C. for 3 hours to perform a ring-opening polymerization reaction, thereby obtaining a ring-opened polymer solution. The polymerization conversion rate in this polymerization reaction was 97%.

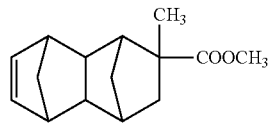

(a)

Next, 1,000 parts of the thus obtained ring-opened polymer solution was loaded to an autoclave and 0.12 parts of RuHCl (CO) [P(C$_6$H$_5$)$_3$]$_3$ was added to this ring-opened polymer solution. The resultant was heated with stirring for 3 hours at a hydrogen gas pressure of 100 kg/cm$^2$ and a reaction temperature of 165° C. to perform a hydrogenation reaction.

After cooling the thus obtained reaction solution (hydrogenated polymer solution), the pressure of the hydrogen gas was discharged. This reaction solution was poured into a large amount of methanol and the resulting precipitate was separated and recovered. This precipitate was then dried to obtain a hydrogenated polymer (hereinafter, also referred to as "resin A"). The thus obtained resin A had a number-average molecular weight (Mn) of 32,000, a weight-average molecular weight (Mw) of 137,000 and a glass transition temperature (Tg) of 165° C.

Synthesis Example 2

To a 3-L four-necked flask, 35.12 g (0.253 mol) of 2,6-difluorobenzonitrile, 125.65 g (0.250 mol) of 9,9-bis(3-phenyl-4-hydroxyphenyl)fluorene, 41.46 g (0.300 mol) of potassium carbonate, 443 g of N,N-dimethylacetamide (hereinafter, also referred to as "DMAc") and 111 g of toluene were added. Subsequently, the four-necked flask was fitted with a thermometer, a stirrer, a nitrogen-introducing tube-equipped three-way stopcock, a Dean-Stark tube and a cooling tube.

Then, after replacing the atmosphere in the flask with nitrogen, the thus obtained solution was allowed to react at 140° C. for 3 hours and generated water was removed from the Dean-Stark tube as needed. Once water became no longer generated, the temperature was slowly raised to 160° C. and the solution was allowed to react at this temperature for 6 hours.

After cooling the solution to room temperature (25° C.), generated salt was removed using a filter paper. The filtrate was then added to methanol for reprecipitation and the resulting precipitate (residue) was isolated by filtration. The thus obtained residue was vacuum-dried overnight at 60° C. to obtain a white powder B (hereinafter, also referred to as "resin B") (amount: 95.67 g, yield: 95%).

The structure of the thus obtained resin B was analyzed. As a result, the absorption characteristics of the infrared absorption spectrum were found as follows: 3035 cm$^{-1}$ (C—H stretching), 2229 cm$^{-1}$ (CN), 1574 cm$^{-1}$ and 1499 cm$^{-1}$ (aromatic-ring skeleton absorption) and 1240 cm$^{-1}$ (—O—). The resin B had a number-average molecular weight (Mn) of 67,000, a weight-average molecular weight (Mw) of 146,000, a glass transition temperature (Tg) of 275° C. and the above-described structural unit (1).

Synthesis Example 3

A resin C was obtained in the same manner as in Synthesis Example 2, except that 87.60 g (0.250 mol) of 9,9-bis(4-hydroxyphenyl)fluorene was used in place of 125.65 g (0.250 mol) of 9,9-bis(3-phenyl-4-hydroxyphenyl)fluorene.

The thus obtained resin C had a number-average molecular weight (Mn) of 75,000, a weight-average molecular weight (Mw) of 188,000 and a glass transition temperature (Tg) of 285° C.

Synthesis Example 4

A resin D was obtained in the same manner as in Synthesis Example 2, except that 78.84 g (0.225 mol) of 9,9-bis(4-hydroxyphenyl)fluorene and 6.71 g (0.025 mol) of 1,1-bis(4-hydroxyphenyl)cyclohexane were used in place of 125.65 g (0.250 mol) of 9,9-bis(3-phenyl-4-hydroxyphenyl)fluorene. The thus obtained resin D had a number-average molecular weight (Mn) of 36,000, a weight-average molecular weight (Mw) of 78,000 and a glass transition temperature (Tg) of 260° C.

Synthesis Example 5

A resin E was obtained in the same manner as in Synthesis Example 2, except that 63.56 g (0.250 mol) of 4,4-difluorodiphenyl sulfone (DFDS) was used in place of 35.12 g (0.253 mol) of 2,6-difluorobenzonitrile. The thus obtained resin E had a number-average molecular weight (Mn) of 37,000, a weight-average molecular weight (Mw) of 132,000 and a glass transition temperature (Tg) of 265° C.

Example 1

To a vessel, 100 parts by weight of the resin A obtained in Synthesis Example 1, 0.01 parts by weight of a squarylium-based compound "a-10" (compound represented by the above-described Formula (a-10)) and methylene chloride were added, thereby obtaining a solution (ex 1) having a resin concentration of 20% by weight.

Subsequently, the thus obtained solution was casted on a smooth glass plate, dried at 20° C. for 8 hours and then detached from the glass plate. This detached coating film was further dried under reduced pressure at 100° C. for 8 hours to obtain a substrate of 0.1 mm in thickness, 60 mm in length and 60 mm in width.

The spectral transmittance of this substrate was measured to determine the absorption maximum wavelength and the transmittance at a wavelength of 640 nm.

The results thereof are shown in Table 1.

The absorption maximum wavelength of the substrate was 699 nm and the transmittance at wavelength of 640 nm was 82%.

Subsequently, on one side of the substrate, a vapor-deposited multilayer film reflecting near-infrared ray [a film in which silica layers ($SiO_2$: layer thickness=35 to 190 nm) and titania layers ($TiO_2$: layer thickness=12 to 112 nm) were alternately stacked; number of stacked layers: 20] was formed at a vapor deposition temperature of 100° C. and, on the other side of the substrate, a vapor-deposited multilayer film reflecting near-infrared ray [a film in which silica layers ($SiO_2$: layer thickness=33 to 161 nm) and titania layers ($TiO_2$: layer thickness=10 to 101 nm) were alternately stacked; number of stacked layers: 22] was formed at a vapor deposition temperature of 100° C., thereby obtaining a 0.105 mm-thick near-infrared cut filter. The spectral transmittance of the thus obtained near-infrared cut filter was measured to determine (Ya) and (Yb).

Figure 4:
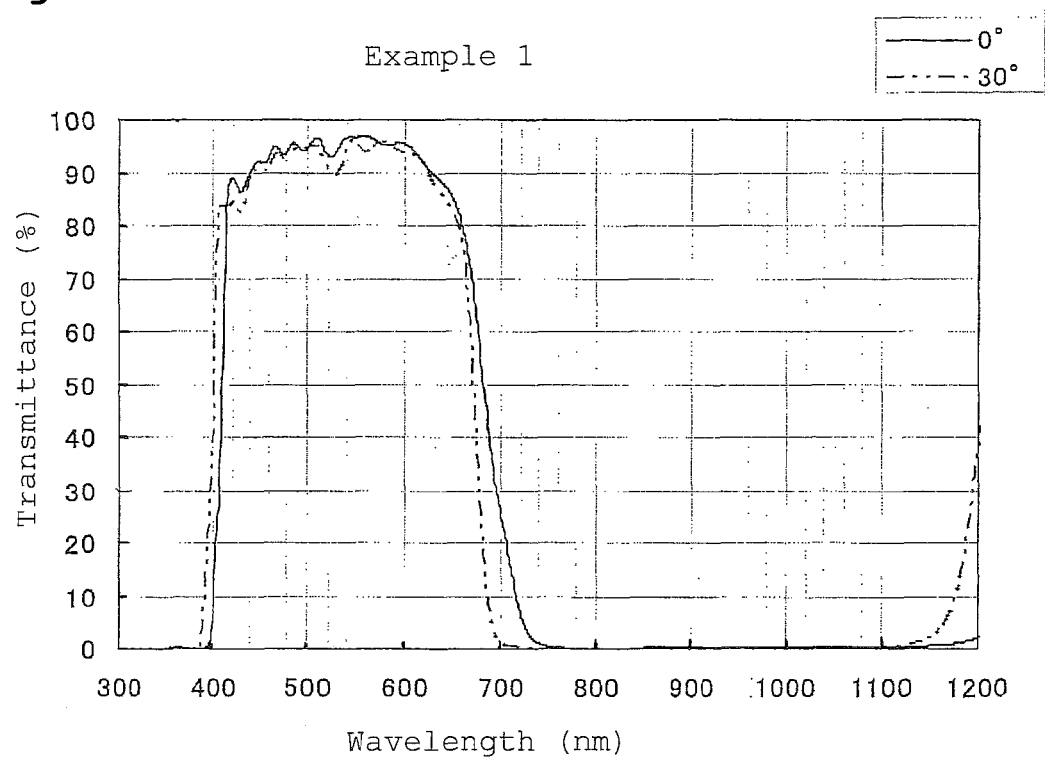
FIG. 4 shows the transmittance curve (0°) of the near-infrared cut filter obtained in Example 1, which was measured in the vertical direction, and the transmittance curve (30°) of the same filter, which was measured at an angle of 30° with respect to the vertical direction.

The results thereof are shown in Table 1. In addition, the transmittance curve is shown in FIG. 4.

The average transmittance in the wavelength range of 430 to 580 nm was 93%, the average transmittance in the wavelength range of 630 to 650 nm was 88%, and the average transmittance in the wavelength range of 800 to 1,000 nm was 1% or lower.

Furthermore, in the wavelength range of 550 to 700 nm, the absolute value of the difference between the value of the wavelength at which the transmittance measured in the vertical direction of the filter was 75% (Ya) and the value of the wavelength at which the transmittance measured at an angle of 30° with respect to the vertical direction of the filter was 75% (Yb), |Ya−Yb|, was 3 nm.

Example 2

On one side of the substrate prepared in Example 1, a vapor-deposited multilayer film reflecting near-infrared ray [a film in which silica layers ($SiO_2$: layer thickness=36 to 190 nm) and titania layers ($TiO_2$: layer thickness=11 to 113 nm) were alternately stacked; number of stacked layers: 40] was formed at a vapor deposition temperature of 100° C., thereby obtaining a 0.104 mm-thick near-infrared cut filter. The results of evaluating the thus obtained near-infrared cut filter in the same manner as in Example 1 are shown in Table 1.

Example 3

On both sides of the substrate prepared in Example 1, a hard-coat agent, "BEAMSET" manufactured by Arakawa Chemical Industries, Ltd., was coated using a bar coater such that the film on each side had a thickness of 0.002 mm after curing. The hard-coat agent was then cured by UV irradiation to obtain a substrate of 0.104 mm in thickness, 60 mm in length and 60 mm in width.

Further, using this substrate, a 0.109 mm-thick near-infrared cut filter was produced in the same manner as in Example 1. The results of evaluating the thus obtained near-infrared cut filter in the same manner as in Example 1 are shown in Table 1.

Example 4

On both sides of the substrate prepared in Example 1, a composition in which tricyclodecane dimethanol diacrylate and methyl ethyl ketone were mixed at a ratio of 50:50 was coated using a bar coater such that the film on each side had a thickness of 0.002 mm after drying. The composition was then cured by UV irradiation to obtain a substrate of 0.104 mm in thickness, 60 mm in length and 60 mm in width.

Further, using this substrate, a 0.109 mm-thick near-infrared cut filter was produced in the same manner as in Example 1. The results of evaluating the thus obtained near-infrared cut filter in the same manner as in Example 1 are shown in Table 1.

Example 5

A substrate of 0.1 mm in thickness, 60 mm in length and 60 mm in width was obtained in the same manner as in Example 1, except that a cyclic olefin-based resin, "ARTON G" manufactured by JSR Corporation, was used in place of the resin A.

Further, using this substrate, a 0.105 mm-thick near-infrared cut filter was produced in the same manner as in Example 1. The results of evaluating the thus obtained near-infrared cut filter in the same manner as in Example 1 are shown in Table 1.

Example 6

A substrate of 0.1 mm in thickness, 60 mm in length and 60 mm in width was obtained in the same manner as in Example 1, except that a polycarbonate resin, "PURE-ACE", was used in place of the resin A.

Further, using this substrate, a 0.105 mm-thick near-infrared cut filter was produced in the same manner as in Example 1. The results of evaluating the thus obtained near-infrared cut filter in the same manner as in Example 1 are shown in Table 1.

Example 7

A substrate of 0.1 mm in thickness, 60 mm in length and 60 mm in width was obtained in the same manner as in Example 1, except that the resin B obtained in Synthesis Example 2 was used in place of the resin A.

Further, using this substrate, a 0.105 mm-thick near-infrared cut filter was produced in the same manner as in Example 1. The results of evaluating the thus obtained near-infrared cut filter in the same manner as in Example 1 are shown in Table 1.

Example 8

A substrate of 0.1 mm in thickness, 60 mm in length and 60 mm in width was obtained in the same manner as in Example 1, except that the resin C obtained in Synthesis Example 3 was used in place of the resin A.

Further, using this substrate, a 0.105 mm-thick near-infrared cut filter was produced in the same manner as in Example 1. The results of evaluating the thus obtained near-infrared cut filter in the same manner as in Example 1 are shown in Table 1.

Example 9

A substrate of 0.1 mm in thickness, 60 mm in length and 60 mm in width was obtained in the same manner as in Example 1, except that the resin D obtained in Synthesis Example 4 was used in place of the resin A.

Further, using this substrate, a 0.105 mm-thick near-infrared cut filter was produced in the same manner as in Example 1. The results of evaluating the thus obtained near-infrared cut filter in the same manner as in Example 1 are shown in Table 1.

Example 10

A substrate of 0.1 mm in thickness, 60 mm in length and 60 mm in width was obtained in the same manner as in Example 1, except that the resin E obtained in Synthesis Example 5 was used in place of the resin A.

Further, using this substrate, a 0.105 mm-thick near-infrared cut filter was produced in the same manner as in Example 1. The results of evaluating the thus obtained near-infrared cut filter in the same manner as in Example 1 are shown in Table 1.

Example 11

Figure 5:
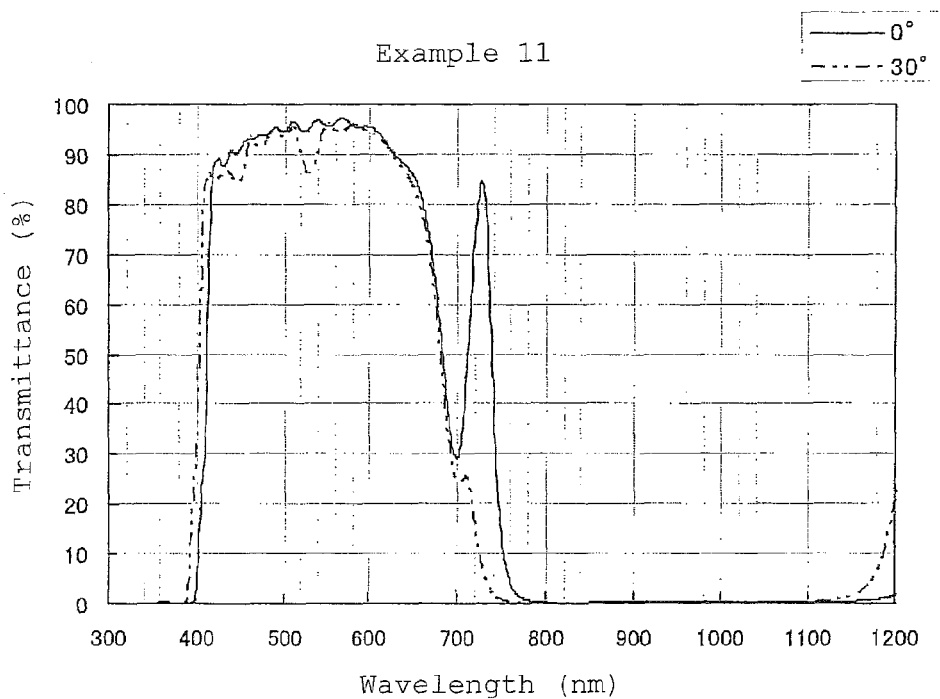
FIG. 5 shows the transmittance curve (0°) of the near-infrared cut filter obtained in Example 11, which was measured in the vertical direction, and the transmittance curve (30°) of the same filter, which was measured at an angle of 30° with respect to the vertical direction.

On one side of the substrate prepared in Example 1, a vapor-deposited multilayer film reflecting near-infrared ray [a film in which silica layers ($SiO_2$: layer thickness=35 to 190 nm) and titania layers ($TiO_2$: layer thickness=12 to 112 nm) were alternately stacked; number of stacked layers: 20] was formed at a vapor deposition temperature of 100° C. and, on the other side of the substrate, a vapor-deposited multilayer film reflecting near-infrared ray [a film in which silica layers ($SiO_2$: layer thickness=34 to 166 nm) and titania layers ($TiO_2$: layer thickness=11 to 103 nm) were alternately stacked; number of stacked layers: 22] was formed at a vapor deposition temperature of 100° C., thereby obtaining a 0.105 mm-thick near-infrared cut filter. The results of evaluating the thus obtained near-infrared cut filter in the same manner as in Example 1 are shown in Table 1. In addition, the transmittance curve is shown in FIG. 5.

Comparative Example 1

A substrate of 0.1 mm in thickness, 60 mm in length and 60 mm in width was obtained in the same manner as in Example 1, except that a solution having a solid content of 20%, which was obtained by dissolving the resin A in methylene chloride, was used in place of the solution (ex 1).

Further, using this substrate, a 0.105 mm-thick near-infrared cut filter was produced in the same manner as in Example 1. The results of evaluating the thus obtained near-infrared cut filter in the same manner as in Example 1 are shown in Table 1.

Reference Example 1

A substrate of 0.1 mm in thickness, 60 mm in length and 60 mm in width was obtained in the same manner as in Example 5, except that the squarylium-based compound "a-10" was used in an amount of 0.04 parts by weight.

Figure 6:
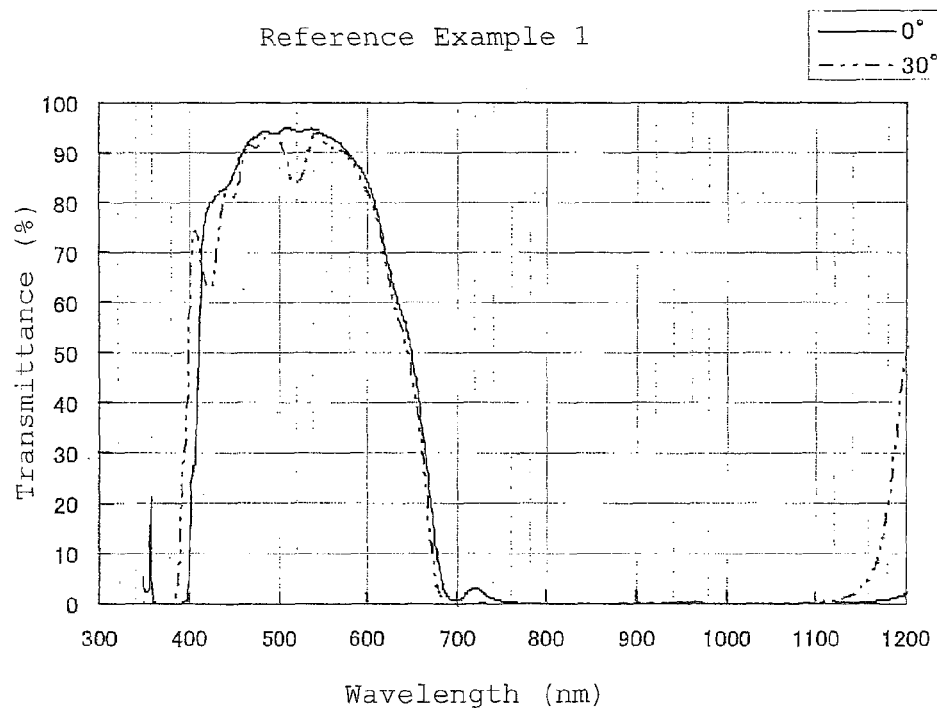
FIG. 6 shows the transmittance curve (0°) of the near-infrared cut filter obtained in Reference Example 1, which was measured in the vertical direction, and the transmittance curve (30°) of the same filter, which was measured at an angle of 30° with respect to the vertical direction.

Further, using this substrate, a 0.105 mm-thick near-infrared cut filter was produced in the same manner as in Example 1. The results are shown in Table 1. Also, the transmittance curve is shown in FIG. 6.

|  | Transparent resin substrate | | Near-infrared cut filter | | | |
|---|---|---|---|---|---|---|
|  | Absorption maximum wavelength | Transmittance at a wavelength of 640 nm | Average transmittance in the wavelength range of 430 nm to 580 nm | Average transmittance in the wavelength range of 800 nm to 1,000 nm | Average transmittance in the wavelength range of 630 nm to 650 nm | \|Ya − Yb\| |
| Example 1 | 699 nm | 82% | 93% | 1% or lower | 88% | 3 nm |
| Example 2 | 699 nm | 82% | 91% | 1% or lower | 85% | 3 nm |
| Example 3 | 699 nm | 82% | 93% | 1% or lower | 88% | 3 nm |
| Example 4 | 699 nm | 82% | 93% | 1% or lower | 88% | 3 nm |
| Example 5 | 699 nm | 82% | 93% | 1% or lower | 88% | 3 nm |
| Example 6 | 707 nm | 80% | 87% | 1% or lower | 84% | 5 nm |
| Example 7 | 705 nm | 76% | 87% | 1% or lower | 80% | 5 nm |
| Example 8 | 704 nm | 76% | 87% | 1% or lower | 80% | 5 nm |

-continued

| | Transparent resin substrate | | Near-infrared cut filter | | | |
|---|---|---|---|---|---|---|
| | Absorption maximum wavelength | Transmittance at a wavelength of 640 nm | Average transmittance in the wavelength range of 430 nm to 580 nm | Average transmittance in the wavelength range of 800 nm to 1,000 nm | Average transmittance in the wavelength range of 630 nm to 650 nm | \|Ya − Yb\| |
| Example 9 | 706 nm | 76% | 87% | 1% or lower | 80% | 5 nm |
| Example 10 | 708 nm | 76% | 87% | 1% or lower | 80% | 6 nm |
| Example 11 | 699 nm | 82% | 93% | 1% or lower | 88% | 2 nm |
| Comparative Example 1 | none | 91% | 93% | 1% or lower | 96% | 33 nm |
| Reference Example 1 | 699 nm | 55% | 91% | 1% or lower | 58% | 1 nm |

INDUSTRIAL APPLICABILITY

The near-infrared cut filter of the present invention can be suitably used in digital still cameras, cell phone cameras, digital video camcorders, PC cameras, surveillance cameras, vehicle cameras and the like.

DESCRIPTION OF SYMBOLS

1: camera module
2: lens barrel
3: flexible substrate
4: hollow package
5: lens
6: near-infrared cut filter
6': near-infrared cut filter obtained in the present invention
7: CCD or CMOS image sensor
8: near-infrared cut filter
9: spectrophotometer

The invention claimed is:

1. A near-infrared cut filter, comprising a resin substrate and a near infrared-reflecting film, wherein the resin substrate comprises:
a resin; and
a light absorber comprising a structure derived from a compound represented by Formula (II),
wherein said light absorber is contained in said resin substrate in an amount of 0.001 to 0.01 parts by weight with respect to 100 parts by weight of said resin:

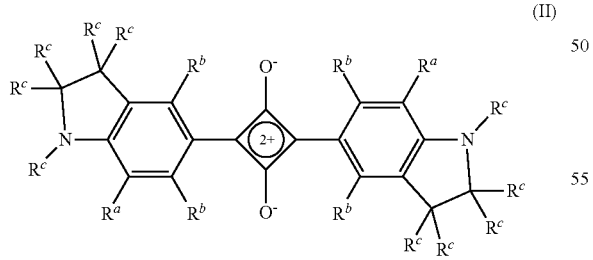

(II)

wherein:
each $R^a$ independently represents a hydrogen atom, an alkyl group having 1 to 8 carbon atoms, a —$NR^eR^f$ group or a hydroxy group, wherein $R^e$ and $R^f$ each independently represent a hydrogen atom or an alkyl group having 1 to 5 carbon atoms;
each $R^b$ independently represents a hydrogen atom, an alkyl group having 1 to 5 carbon atoms, a —$NR^gR^h$ group or a hydroxy group, wherein $R^g$ and $R^h$ each independently represent a hydrogen atom, an alkyl group having 1 to 5 carbon atoms or a —$C(O)R^i$ group, and $R^i$ represents an alkyl group having 1 to 5 carbon atoms; and
each $R^c$ independently represents a hydrogen atom, an aliphatic hydrocarbon group having 1 to 8 carbon atoms, a substituted aliphatic hydrocarbon group having 1 to 8 carbon atoms in which at least one hydrogen atom is substituted with a substituent, an aromatic hydrocarbon group having 6 to 12 carbon atoms or a substituted aromatic hydrocarbon group having 6 to 12 carbon atoms in which at least one hydrogen atom is substituted with an alkyl group,
wherein
the near-infrared cut filter has transmittance satisfying (A) to (D):
(A) in a wavelength range of 430 to 580 nm, the average transmittance measured in a direction perpendicular to a surface of said near-infrared cut filter is 80% or higher;
(B) in a wavelength range of 630 to 650 nm, the average transmittance measured in the direction perpendicular to the surface of said near-infrared cut filter is 70% or higher;
(C) in a wavelength range of 800 to 1,000 nm, the average transmittance measured in the direction perpendicular to the surface of said near-infrared cut filter is 20% or lower; and
(D) in a wavelength range of 550 to 700 nm, an absolute value of a difference between a wavelength at which a transmittance measured in the direction perpendicular to the surface of said near-infrared cut filter is 75% and a wavelength at which a transmittance measured at an angle of 30° with respect to the direction perpendicular to the surface of said near-infrared cut filter is 75% is less than 15 nm, and
wherein the near infrared-reflecting film is a dielectric multilayer film.

2. The near-infrared cut filter according to claim 1, wherein said resin is a cyclic olefin-based resin or an aromatic polyether-based resin.

3. The near-infrared cut filter according to claim 1, wherein the near-infrared cut filter is a near-infrared cut filter used for a solid-state image sensing element.

4. A solid-state imaging device, comprising the near-infrared cut filter according to claim 1.

5. A camera module, comprising the near-infrared cut filter according to claim 1.

6. The near-infrared cut filter according to claim 1, wherein the near infrared-reflecting film is provided on the resin substrate.

7. The near-infrared cut filter according to claim 1, wherein a thickness of the near-infrared cut filter is in a range of 50 to 250 μm.

* * * * *